(12) United States Patent
Sounart et al.

(10) Patent No.: US 12,255,225 B2
(45) Date of Patent: Mar. 18, 2025

(54) LOW LEAKAGE THIN FILM CAPACITORS USING TITANIUM OXIDE DIELECTRIC WITH CONDUCTING NOBLE METAL OXIDE ELECTRODES

(71) Applicant: Intel Corporation, Santa Clara, CA (US)

(72) Inventors: Thomas Sounart, Chandler, AZ (US); Kaan Oguz, Portland, OR (US); Neelam Prabhu Gaunkar, Chandler, AZ (US); Aleksandar Aleksov, Chandler, AZ (US); Henning Braunisch, Phoenix, AZ (US); I-Cheng Tung, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 953 days.

(21) Appl. No.: 17/033,279

(22) Filed: Sep. 25, 2020

(65) Prior Publication Data

US 2022/0102483 A1  Mar. 31, 2022

(51) Int. Cl.
*H01L 21/00* (2006.01)
*H01L 49/02* (2006.01)

(52) U.S. Cl.
CPC .............. *H01L 28/65* (2013.01); *H01L 28/55* (2013.01); *H01L 28/75* (2013.01)

(58) Field of Classification Search
CPC .......... H01L 28/65; H01L 28/55; H01L 28/75
See application file for complete search history.

(56) References Cited

U.S. PATENT DOCUMENTS

| | | | |
|---|---|---|---|
| 2006/0214204 A1* | 9/2006 | Yoo | H10B 53/30 257/295 |
| 2007/0045689 A1* | 3/2007 | Lim | H01L 28/55 257/295 |
| 2016/0217931 A1* | 7/2016 | Saita | H01G 4/33 |
| 2020/0006258 A1 | 1/2020 | Aleksov et al. | |
| 2020/0350303 A1 | 11/2020 | Sounart et al. | |

* cited by examiner

*Primary Examiner* — Richard A Booth
(74) *Attorney, Agent, or Firm* — Essential Patents Group, LLP

(57) ABSTRACT

Low leakage thin film capacitors for decoupling, power delivery, integrated circuits, related systems, and methods of fabrication are disclosed. Such thin film capacitors include a titanium dioxide dielectric and one or more noble metal oxide electrodes. Such thin film capacitors are suitable for high voltage applications and provide low current density leakage.

20 Claims, 13 Drawing Sheets

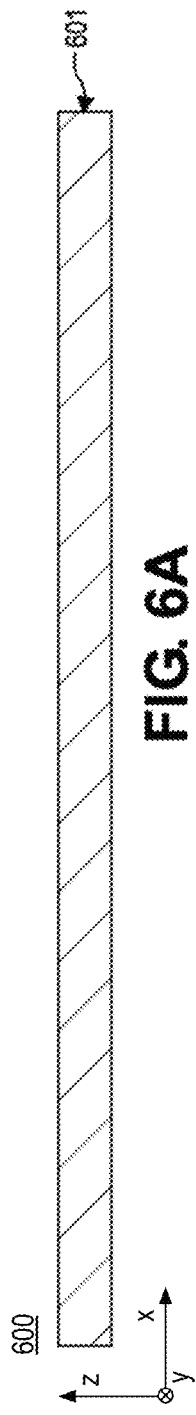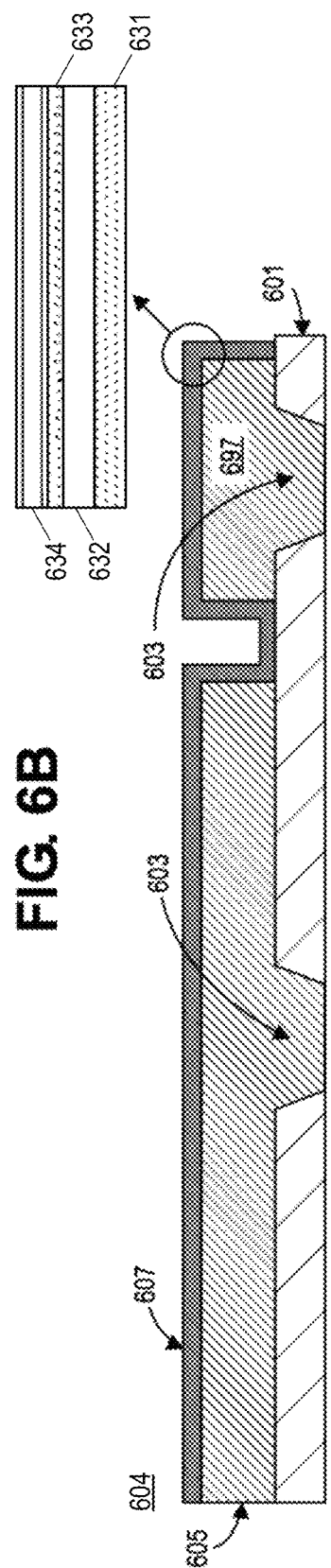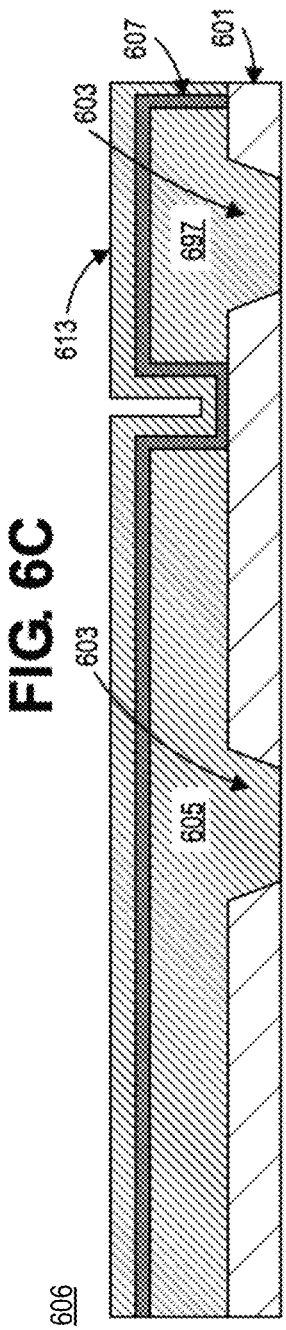

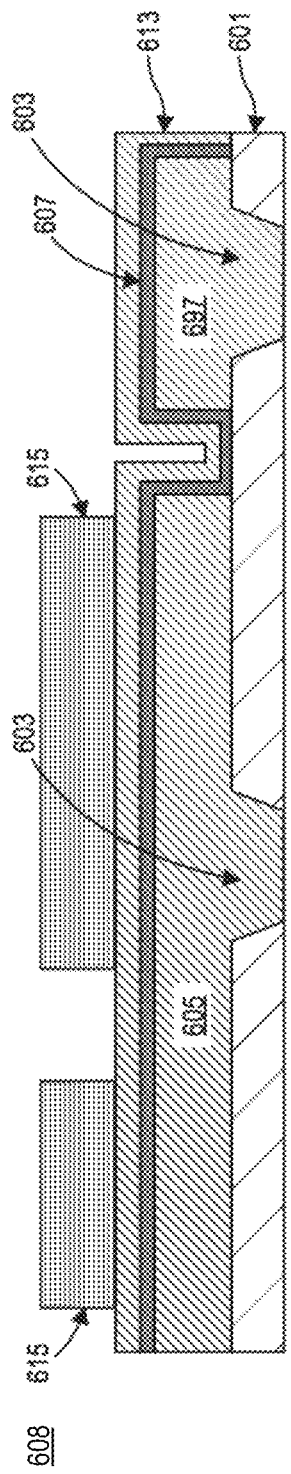
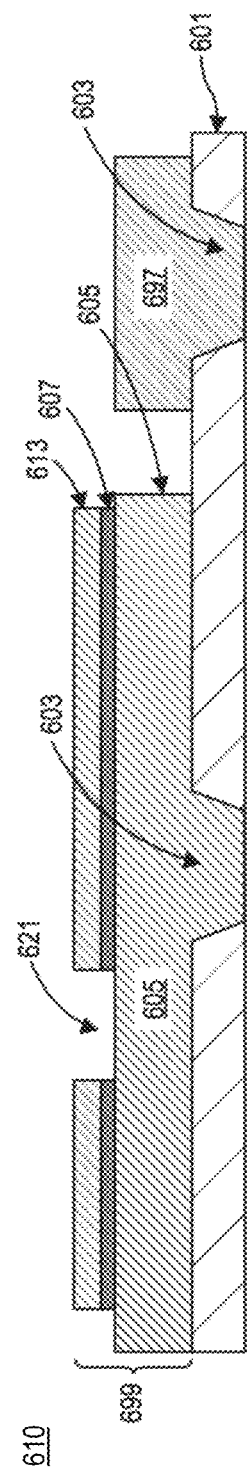
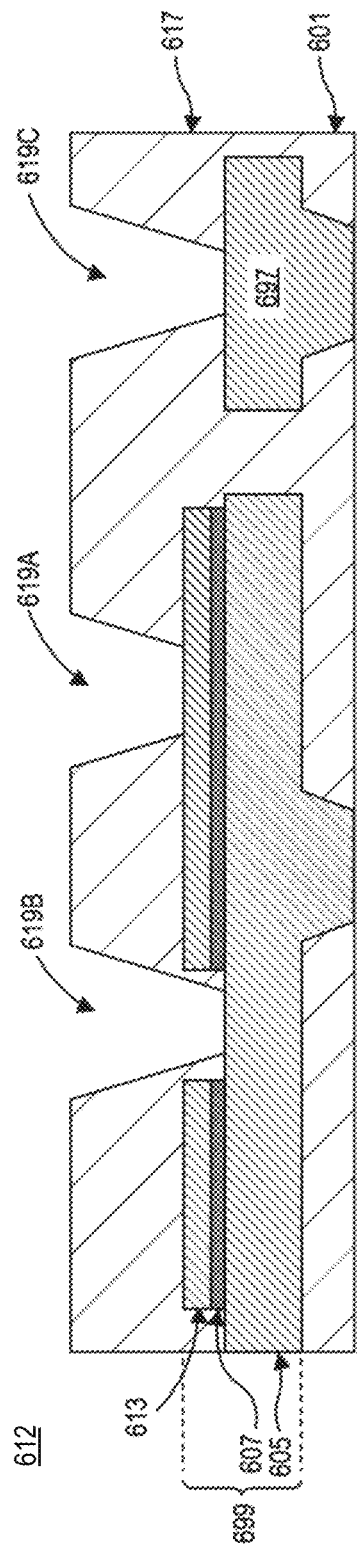
FIG. 6E
FIG. 6F
FIG. 6G

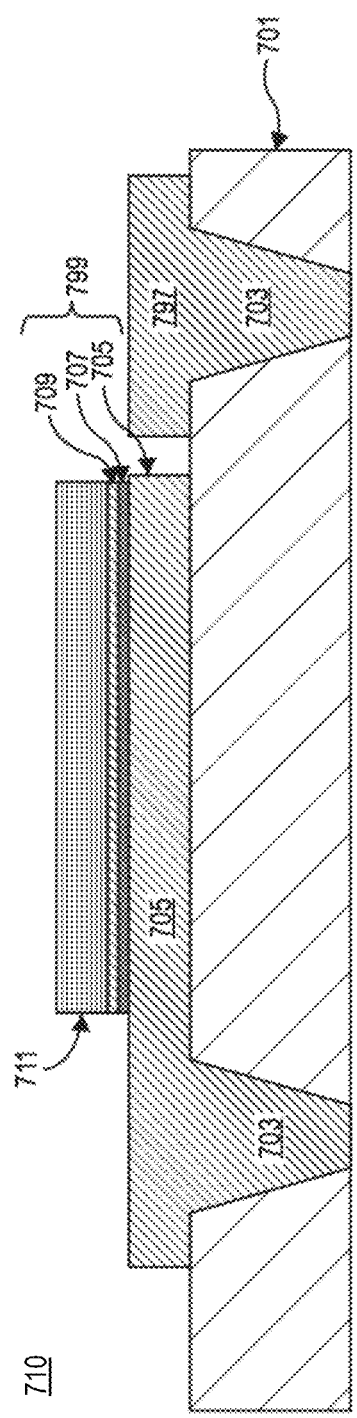
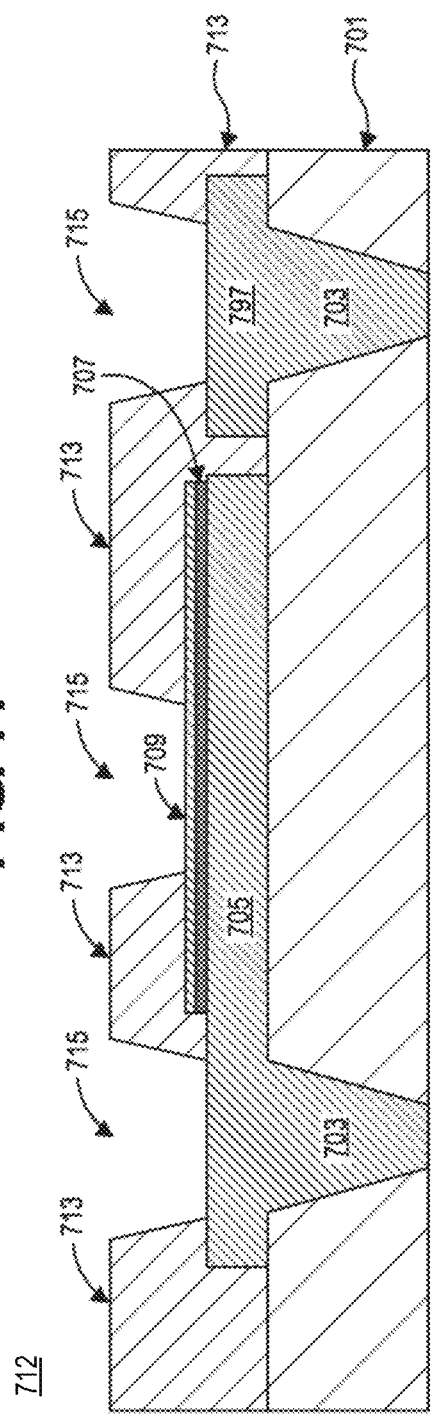
FIG. 7F
FIG. 7G

LOW LEAKAGE THIN FILM CAPACITORS USING TITANIUM OXIDE DIELECTRIC WITH CONDUCTING NOBLE METAL OXIDE ELECTRODES

BACKGROUND

Decoupling capacitors are used to supply current to processor die during transient spikes in power demand and to minimize power supply noise. Power delivery requirements for processors such as server processors include an increasing demand for more decoupling capacitance on or close to the die to prevent excessive voltage droop on critical voltage rails such as the $V_{cc,in}$ and $V_{cc,out}$, the voltage regulator input and output, respectively. Standard $V_{cc,in}$ operational voltage is 1.8 V, but power delivery efficiency can be improved substantially by increasing this voltage to 3 V or even further to 5 V. Current decoupling capacitors cannot operate at greater than 2 V. For example, metal-insulator-metal (MIM) decoupling capacitors on die use thin dielectric layers to achieve the required capacitance density, which results in electric fields approaching the dielectric strength of 2-4 MV/cm at 2 V.

It is desirable to provide decoupling capacitors that are capable of operating at higher operation voltages and low leakage current. It is with respect to these and other considerations that the present improvements have been needed. Such improvements may become critical as the desire to implement thin film decoupling capacitors becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 6A, 6B, 6C, 6D, 6E, 6F, and 6G are cross-sectional views of exemplary thin film capacitor structures as selected fabrication operations in the methods of FIG. 5 are performed;

FIGS. 7A, 7B, 7C, 7D, 7E, 7F, 7G, 7H, and 7I are cross-sectional views of exemplary thin film capacitor structures as selected fabrication operations in the methods of FIG. 5 are performed;

DETAILED DESCRIPTION

Figure 1:
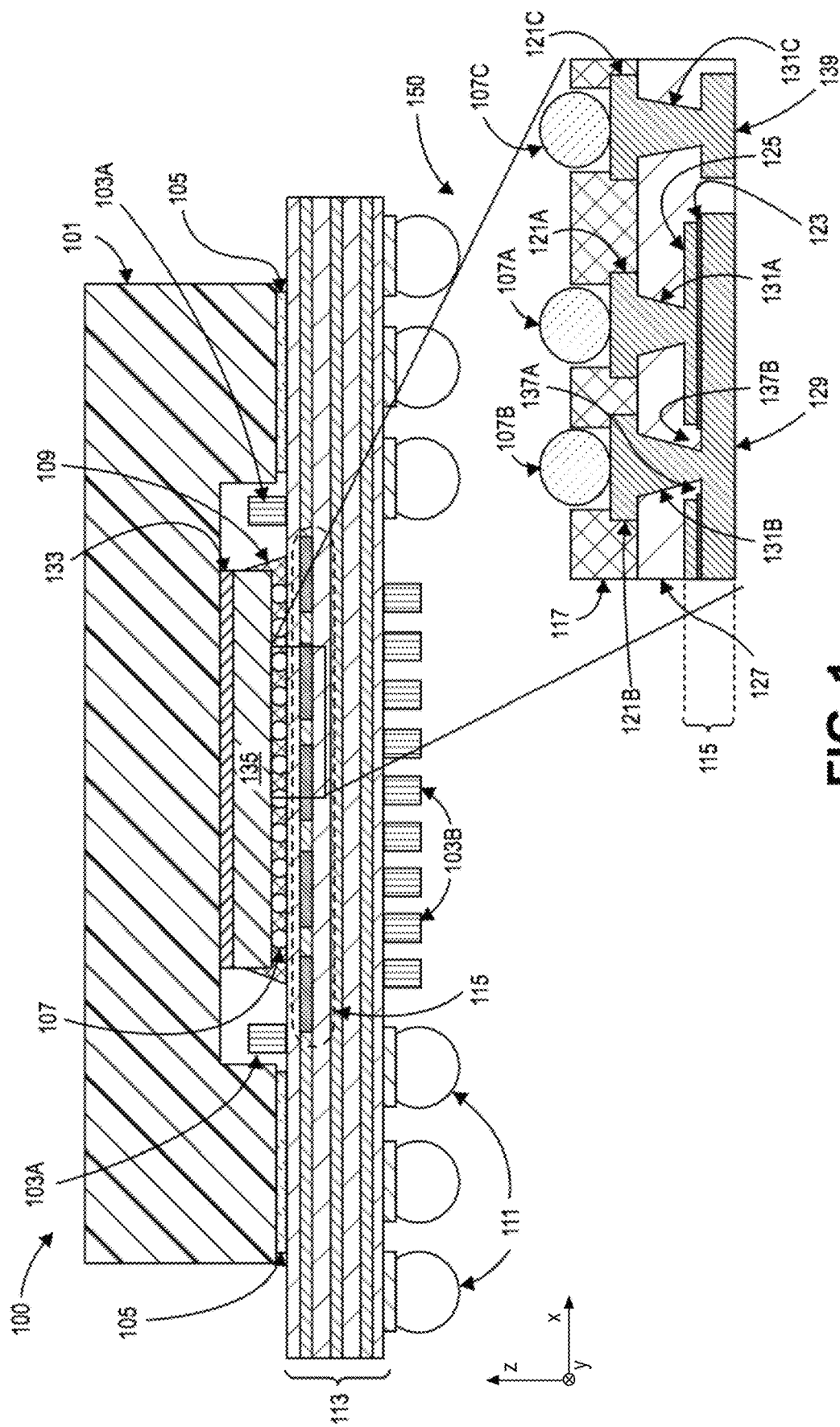
FIG. 1 is an illustration of a cross-sectional side view of a semiconductor package including a thin film capacitor in a portion of an electronic package.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direction contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Thin film capacitor structures, device structures, apparatuses, integrated circuits, computing platforms, and methods are described herein related to thin film capacitors having one or both electrodes including a noble metal oxide.

As described above, it may be advantageous to provide low leakage thin film capacitors that are capable at operating at higher operational voltages such as voltages of 3 V, 5V or more. In some embodiments, a thin film capacitor includes a dielectric layer between first and second electrodes such that the dielectric layer includes titanium oxide (i.e., includes titanium and oxygen) and one or both of the first and second electrodes includes a noble metal oxide (i.e., includes a noble metal and oxygen). As used herein, the term noble metal indicates those metals that are resistive to corrosion and oxidation and includes the following: ruthenium, rhodium, palladium, silver, osmium, iridium, platinum, and gold. In some embodiments, both the first and second electrodes includes a noble metal oxide such that the noble metal may be the same or different between the two electrodes. In some embodiments, only one of the first and second electrodes includes a noble metal oxide. In some such embodiments, the other electrode may include the noble metal substantially absent oxygen. As used herein, the term substantially absent with respect to a material composition indicates no or very little (e.g., <0.1%) of the element is in the material composition.

Notably, titanium oxide (inclusive of titanium dioxide ($TiO_2$)) is a paraelectric dielectric that has a higher relative permittivity (40-150) relative to other high-k dielectrics even with low temperature deposition in an amorphous or nanocrystalline state. However, oxygen vacancy defects generated from thermal processing during subsequent processing (e.g., package assembly, such as reflow at about 250° C., or other downstream processing) can cause excessive leakage current. The structures and techniques discussed herein advantageously employ conductive noble metal oxide electrodes with titanium oxide dielectric to reduce or eliminate such oxygen vacancy formation and achieve high permittivity capacitors with low leakage.

Structures and techniques discussed herein provide decoupling capacitors using a dielectric layer of titanium oxide. In some embodiments, the titanium oxide is titanium dioxide. In some embodiments, the titanium oxide may be deficient in oxygen relative to titanium dioxide. In some embodiments, the titanium oxide dielectric layer is relatively thick (e.g., 20-100 nm). In some embodiments, the titanium oxide dielectric layer has a nanocrystalline material microstructure. As used herein, the term nanocrystalline indicates a polycrystalline material with a crystallite size (e.g., average crystallite size as taken over a representative number of crystallite samples) on the order of a few nanometers (e.g., 2-10 nm). In some embodiments, the titanium oxide dielectric layer has an amorphous material microstructure. As used herein, the term amorphous indicates a material that lacks long range order. Such titanium oxide dielectric layers have a high k (e.g., 80-100) and may be deposited via a sputtering process. To avoid leakage using the titanium oxide dielectric layer, one or both capacitor electrode materials on or immediately adjacent to the titanium oxide dielectric layer are formed of a noble metal oxide (i.e., ruthenium oxide, rhodium oxide, palladium oxide, silver oxide, osmium oxide, iridium oxide, platinum oxide, or gold oxide). Such a noble metal oxide electrode or electrodes reduce, eliminate, or minimize oxygen vacancy defect formation in the titanium oxide dielectric layer for improved performance. For example, even relatively low temperature thermal processing (such as ball attach reflow) can cause unacceptably high leakage currents at 3 to 5 V, but at least one conducting noble metal oxide electrode may minimize the leakage after reflow or other downstream processing. If only one electrode is provided as a noble metal oxide, the other electrode may be a noble metal substantially absent oxygen or another noble metal oxide electrode using the same or different noble metal. Such electrode materials minimize oxygen vacancy defect formation and provide a leakage current below acceptable limits after subsequent thermal processing including reflow. Furthermore, all steps of the capacitor fabrication process may advantageously use process temperatures less than 215° C. such that the capacitors may be fabricated on or in any suitable substrate inclusive of organic package substrates and silicon substrates.

Such thin film capacitors allow higher voltage power delivery in a variety of contexts including system on a chip (SOC) applications. Efficiencies from higher voltage power delivery may be combined with other technologies (e.g., fully integrated voltage regulators, coaxial magnetic integrated inductors, etc.) for overall improved system efficiency and performance.

FIG. 1 is an illustration of a cross-sectional side view of a semiconductor package 100 including a thin film capacitor 115 in a portion 150 of an electronic package, arranged in accordance with at least some implementations of the present disclosure. Portion 150 may also be referred to as an electronic package portion 150. FIG. 1 also provides an enlarged illustration of electronic package portion 150.

As shown, semiconductor package 100, which includes a package substrate 113, a component 135, a heat spreader 101, and other components, is discussed below. In some embodiments, package substrate 113 includes alternating layers of dielectric material (e.g., build-up layers) and metal layers, and a solder resist layer may be positioned on a topmost or a bottommost layer of package substrate 113. Package substrate 113 may be a cored or coreless package substrate. In some embodiments, electronic package portion 150 is integrated as part of package substrate 113. Component 135 is electrically coupled to the package substrate 113. Component 135 may be or include any suitable electronic device or devices. In some embodiments, component 135 is an integrated circuit die, a die stack, or the like. In some embodiments, component 135 is electrically coupled to package substrate 113 by interconnects 107. In some embodiments, an underfill 109 encapsulates interconnects 107 and is between a bottom surface of component 135 and a top surface of package substrate 113. Semiconductor package 100 may also include interconnects 111 on a bottom side of package substrate 113, and interconnects 111 may be bumps, pillars, or the like formed from solder, copper, lead, any other suitable metal or alloy, or any combination thereof.

In some embodiments, semiconductor package 100 includes one or more die side multilayer ceramic capacitors 103A (MLCCs) or one or more landside multilayer ceramic capacitors 103B to provide capacitance for component 135. As shown, MLCCs 103A may be adjacent to a heat spreader 101 and component 135 landside multilayer ceramic capacitors 103B may be positioned on a bottom side of package substrate 113. In some embodiments, semiconductor package 100 may also include one or more on-die metal-insulator-metal (MIM) capacitors (not shown), for example, in component 135 to provide capacitance for component 135.

As discussed, semiconductor package 100 may also include heat spreader 101, which spreads thermal energy from component 135 to a larger area and, optionally to a heat sink positioned over and thermally coupled to heat spreader 101 via a thermal interface material. As shown in FIG. 1, heat spreader 101 may be coupled to package substrate 113 and component 135 using an adhesive 105 and a thermal interface material 133, respectively.

For improved performance of semiconductor package 100, at least one thin film capacitor 115 may be positioned in package substrate 113. As used herein, the term in indicates thin film capacitor 115 is fully or at least partially embedded in package substrate 113. Notably, at least a portion of thin film capacitor 115 may be exposed from package substrate 113. Thin film capacitor 115 provides a decoupling capacitance for semiconductor package 100. For example, thin film capacitor 115 may provide a decoupling capacitance to component 135. In some embodiments, thin film capacitor 115 is formed as part of the package substrate 113 such that thin film capacitor 115 is formed using the manufacturing operations and processes used to form package substrate 113. Thin film capacitor 115 may be positioned anywhere in package substrate 113. In some embodiments, thin film capacitor 115 is positioned in package substrate 113 to span an area of the package substrate 113 under the component 135. In some embodiments, thin film capacitor 115 is located in or on a layer of package substrate 113 under component 135 such that an area (i.e., in the x-y plane) of thin film capacitor 115 at least partially overlaps an area (i.e., in the x-y plane) of component 135.

As discussed, thin film capacitor 115 may be embedded in a layer of package substrate 113. In some embodiments, thin film capacitor 115 is positioned in a topmost layer of the package substrate 113. In some embodiments, thin film capacitor 115 is positioned in a bottommost layer of the package substrate 113. In some embodiments, thin film capacitor 115 is positioned in a middle layer of the package substrate 113. In some embodiments, multiple thin film capacitors 115 are employed in the same or different layers of package substrate 113.

As shown, electronic package portion 150 includes thin film capacitor 115, which includes a bottom electrode 129, a multilayer capacitor material stack 123 on or over bottom electrode 129, and a top electrode 125 on or over multilayer capacitor material stack 123. Herein the term electrode indicates a conductive material through which electricity enters or exits a device or a device portion. Notably, thin film capacitor 115 may include top and bottom (or first and second) electrodes and, each of the top and bottom (or first and second) may include multiple electrodes or electrode layers. For example, as discussed further herein, multilayer capacitor material stack 123 includes a dielectric layer between top and bottom (or first and second) electrodes or electrode layers. The bottom electrode of multilayer capacitor material stack 123 is on or over bottom electrode 129 and top electrode 125 is on or over the top electrode of multilayer capacitor material stack 123.

In some embodiments, each of top electrode 125 and bottom electrode 129 are formed from a conductive material (e.g., a metal, a metal alloy, etc.). Top electrode 125 and bottom electrode 129 may be formed of the same materials or they may be different. In some embodiments, top electrode 125 is a $V_{CC}$ electrode and the bottom electrode 129 is a $V_{SS}$ electrode. In some embodiments, bottom electrode 129 is a $V_{CC}$ electrode and the top electrode 125 is a $V_{SS}$ electrode. Multilayer capacitor material stack 123 includes a dielectric layer between electrode layers as discussed further herein. Although illustrated in FIG. 1 as a single layer for the sake of clarity of presentation, multilayer capacitor material stack 123, it is to be appreciated that multilayer capacitor material stack 123 includes a stack of three or more layers where at least one of the layers is dielectric material such as a high k dielectric material. As used herein, high k dielectrics refer to dielectrics that have a k value that is greater than 10. In some embodiments, high k dielectrics include one or more of hafnium oxide, hafnium silicon oxide, lanthanum oxide, lanthanum aluminum oxide, zirconium oxide, zirconium silicon oxide, hafnium zirconium oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Notably, as discussed below, the dielectric layer of multilayer capacitor material stack 123 is advantageously titanium oxide such as a nanocrystalline or amorphous titanium oxide.

In some embodiments, electronic package portion 150 includes openings 137A, B such that opening 137A is in multilayer capacitor material stack 123 and opening 137B is in top electrode 125. Openings 137A, B may be positioned over one another and reveal a surface of bottom electrode 129. Electronic package portion 150 also includes a via 131A over top electrode 125, a via 131B through openings 137A, B that lands on bottom electrode 129, and a via 131C on a pad 139. Electronic package portion 150 may also include a pad 121A on via 131A, a pad 121B on via 131B, and a pad 121C on via 131C. Furthermore, interconnects 107A-C (e.g., bumps, pillars, etc.) are on pads 121A-C, respectively, such that interconnects 107A-C may be solder, copper, other conductive materials, or any combination thereof.

Each of top electrode 125, multilayer capacitor material stack 123, bottom electrode 129, pad 139, vias 131A-C, and openings 137A, B are positioned or embedded in a build-up layer 127, which may be formed from a build-up film. Furthermore, a solder resist layer 117 may be positioned on build-up layer 127, and solder resist layer 117 includes openings that expose surfaces of pads 121A-C such that interconnects 107A-C are positioned on the exposed surfaces of pads 121A-C. Build-up layer 127 may be the topmost or bottommost layer of package substrate 113 below the topmost or above the bottommost layer of the package substrate 113. The embodiment FIG. 1 illustrates build-up layer 127 as the topmost layer of package substrate 113 such that thin film capacitor 115 may be advantageously placed as close as possible to component 135 to provide thin film capacitor 115 a low inductance path to component 135. However, thin film capacitor 115 may be in any layer of package substrate 113.

Figure 2A:
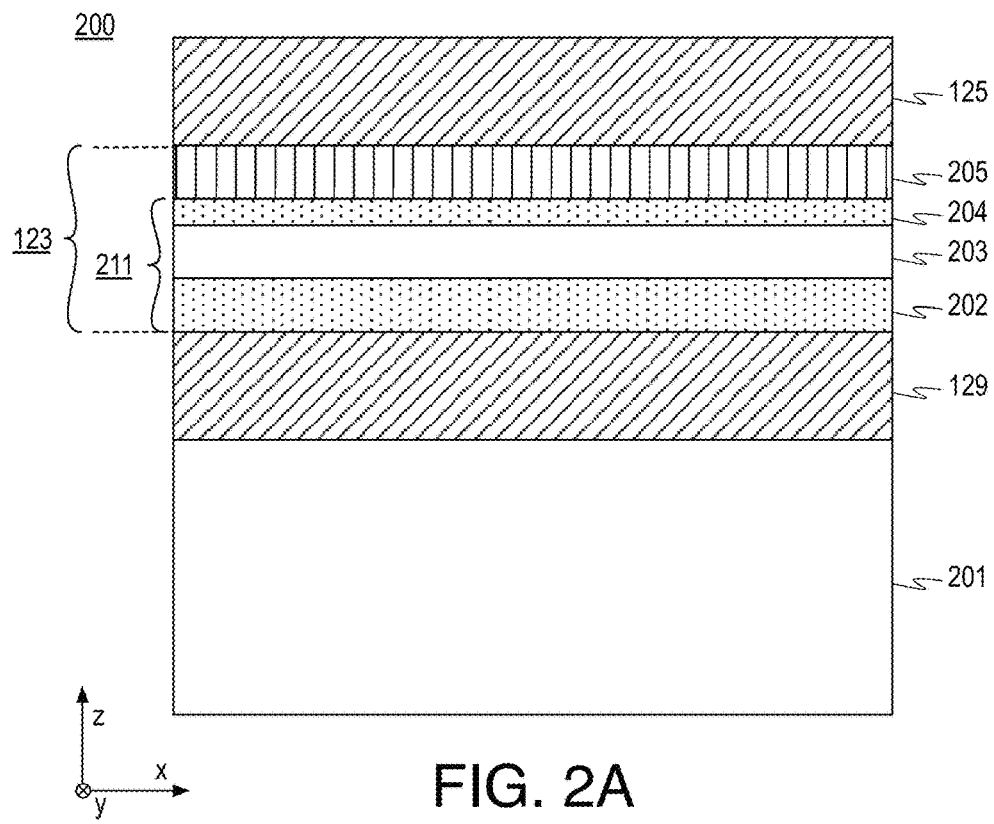
FIG. 2A is an illustration of a cross-sectional view of a thin film capacitor structure including a multilayer capacitor material stack.

FIG. 2A is an illustration of a cross-sectional view of a thin film capacitor structure 200 including multilayer capacitor material stack 123, arranged in accordance with at least some implementations of the present disclosure. As shown, thin film capacitor structure 200 may include a substrate 201, bottom electrode 129 (or bottom conductor), a first electrode 202, a dielectric layer 203, a second electrode 204, a metal layer 205, and top electrode 125 (or top conductor). As discussed, in some embodiments, multilayer capacitor material stack 123 is employed in package substrate 113. For example, substrate 201 may be a portion of package substrate 113. In other embodiments, multilayer capacitor material stack 123 is implemented on or in a motherboard, on or in an integrated circuit die, or the like. For example, substrate 201 may be any suitable microelectronic substrate. In some embodiments, substrate 201 is a motherboard. In some embodiments, substrate 201 is a die substrate. Substrate 201 may include any suitable material and any types of devices. For example, substrate 201 may include any number and type of semiconductor devices formed within a semiconductor substrate material. In some examples, substrate 201 includes a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. Semiconductor devices within substrate 201 may include transistors (planar or non-planar), memory devices, capacitors, resistors, optoelectronic devices, switches, or any other active or passive electronic devices. In some embodiments, substrate 201 includes, ascending in the z-direction, monocrystalline silicon, an insulator layer (such as silicon dioxide having a thickness in the range of 50 to 150 nm) and a conductor layer or patterned conductor layer (such as titanium having a thickness in the range of 50 to 150 nm).

Furthermore, multilayer capacitor material stack 123 inclusive of first electrode 202, dielectric layer 203, second electrode 204, and metal layer 205, having characteristics discussed further herein below, may be employed in such contexts. In some embodiments, a multilayer capacitor material stack 211, exclusive of metal layer 205 but including first electrode 202, dielectric layer 203, and second electrode 204 may be employed in such contexts. That is, metal layer 205 is optional although it may improve performance in some implementations. Bottom electrode 129 (or bottom conductor) and top electrode 125 (or top conductor) may have any characteristics discussed herein. For example, electrodes 129, 125 may provide or be connected to conductive routing of circuitry employing thin film capacitor structure 200. Electrodes 129, 125 may have any suitable thicknesses such as thicknesses (in the z-dimension) in the range of about 50 to 200 nm, 200 to 300 nm, 225 to 325 nm, or the like for applications on a component device (e.g., over a silicon substrate) or thicknesses in the range of about 5 to 25 microns for package substrate applications and may employ any suitable conductive materials such as copper, aluminum, or other known conductive materials.

Thin film capacitor structure 200 may be characterized as a thin film capacitor (TFC), a capacitor structure, an integrated capacitor, or, simply, a capacitor. Thin film capacitor structure 200 may be employed in any suitable circuitry such as power delivery circuitry, power supply circuitry, or other applications. Thin film capacitor structure 200 includes first electrode 202, dielectric layer 203, and second electrode 204.

As discussed, in some embodiments, dielectric layer 203 is formed of titanium oxide. In some embodiments, dielectric layer 203 is amorphous titanium oxide. In some embodiments, dielectric layer 203 is nanocrystalline titanium oxide having a crystallite size on the order of a few nanometers (e.g., 2-10 nm). In some embodiments, dielectric layer 203 is amorphous titanium oxide. Dielectric layer 203 may have any suitable thicknesses such as thicknesses (in the z-dimension). In some embodiments, dielectric layer 203 has a thickness in the range of 20 to 100 nm. In some embodiments, dielectric layer 203 has a thickness in the range of 30 to 50 nm. In some embodiments, dielectric layer 203 has a thickness in the range of 35 to 45 nm. In some embodiments, dielectric layer 203 has a thickness of not less than 20 nm. In some embodiments, dielectric layer 203 has a thickness of not less than 40 nm. In some embodiments, dielectric layer 203 has a thickness in the range of 60 to 100 nm. In some embodiments, dielectric layer 203 has a thickness in the range of 80 to 100 nm. In some embodiments, dielectric layer 203 has a thickness of not less than 80 nm.

Dielectric layer 203 is between first electrode 202 (e.g., a bottom electrode) and second electrode 204 (e.g., a top electrode). In some embodiments, dielectric layer 203 is immediately between first electrode 202 and second electrode 204 such that no intervening materials are therebetween. In some embodiments, a thin material layer may be between one or both of dielectric layer 203 and first electrode 202 or dielectric layer 203 and second electrode 204. One or both of first electrode 202 and second electrode 204 are formed of a noble metal oxide. Notably, it has been found that providing a noble metal oxide in only one of first electrode 202 and second electrode 204 provides the discussed oxygen defect reduction in dielectric layer 203 and stability in the material stack although it may be advantageous to provide a noble metal oxide in both of first electrode 202 and second electrode 204 in some contexts.

In some embodiments, first electrode 202 includes a noble metal oxide and second electrode 204 includes a noble metal substantially absent oxygen. The noble metal in first electrode 202 and the noble metal in second electrode 204 may be the same or they may be different. In some embodiments, one or both of first electrode 202 and second electrode 204 includes one or more of ruthenium oxide (i.e., ruthenium and oxygen), rhodium oxide (i.e., rhodium and oxygen), palladium oxide (i.e., palladium and oxygen), silver oxide (i.e., silver and oxygen), osmium oxide (i.e., osmium and oxygen), iridium oxide (i.e., iridium and oxygen), platinum oxide (i.e., platinum and oxygen), or gold oxide (i.e., gold and oxygen). Notably, when employing a noble metal oxide, the concentration of oxygen through the thickness of first electrode 202 and/or second electrode 204 may be substantially constant. That is, an oxide is not just formed at a surface of first electrode 202 and/or second electrode 204.

The composition of the noble metal oxide (e.g., NMOx, where NM indicates any noble metal element) may be any suitable concentration. In some embodiments, the noble metal oxide is stoichiometric NMOx (i.e., $IrO_2$ in the case of iridium). In some embodiments, the noble metal oxide may be deficient in oxygen (i.e., $IrO_{2-\delta}$ in the case or iridium, where $\delta>0$ and less than 2 but not typically less than 1). In some embodiments, the noble metal oxide includes not less than 30% oxygen. In some embodiments, the noble metal oxide includes not less than 40% oxygen. In some embodiments, the noble metal oxide includes not less than 50% oxygen. In some embodiments, the noble metal oxide includes not less than 60% oxygen. In some embodiments, the noble metal oxide includes an oxygen concentration in the range of 30 to 67% oxygen.

As discussed, one or both of first electrode 202 and second electrode 204 employs a noble metal oxide. In some embodiments, one or both of first electrode 202 and second electrode 204 includes iridium oxide. In some embodiments, one or both of first electrode 202 and second electrode 204 includes ruthenium oxide. In some embodiments, one or both of first electrode 202 and second electrode 204 includes silver oxide. In some embodiments, one or both of first electrode 202 and second electrode 204 includes osmium oxide. Furthermore, in embodiments where only one of first electrode 202 and second electrode 204 includes a noble metal oxide, the other may include a metal having a work function of not less than 5 eV and the metal may be substantially absent oxygen (i.e., it may be a relatively pure metal with no oxidation). In some embodiments, the electrode not employing a noble metal oxide includes a noble metal but is substantially absent oxygen. The electrode including the noble metal oxide and the noble metal, but substantially absent oxygen may use the same noble metal or they may be different.

In some embodiments, both first electrode 202 and second electrode 204 include a noble metal oxide. Such embodiments may provide an improved mechanism of oxygen gettering using the noble metal oxide to getter oxygen from and prevent oxygen vacancies in the titanium oxide of dielectric layer 203. However, it has been found that use of a noble metal oxide in only one of first electrode 202 and second electrode 204 produces the same or similar benefits. As discussed, the noble metal oxide employed in one or both of first electrode 202 and second electrode 204 may be any of ruthenium oxide, rhodium oxide, palladium oxide, silver oxide, osmium oxide, iridium oxide, platinum oxide, or gold oxide. In some embodiments, when one of first electrode 202 and second electrode 204 employs a noble metal oxide, the other employs the same noble metal substantially absent oxygen.

In some embodiments, one of first electrode 202 and second electrode 204 includes ruthenium oxide, rhodium oxide, palladium oxide, silver oxide, osmium oxide, iridium oxide, platinum oxide, or gold oxide and the other includes ruthenium, rhodium, palladium, silver, osmium, iridium, platinum, or gold, respectively, substantially absent oxygen. In some embodiments, one of first electrode 202 and second electrode 204 includes iridium oxide and the other includes one of ruthenium, silver, or osmium, substantially absent oxygen. In some embodiments, one of first electrode 202 and second electrode 204 includes ruthenium oxide and the other includes one of iridium, silver, or osmium, substantially absent oxygen. In some embodiments, one of first electrode 202 and second electrode 204 includes silver oxide and the other includes one of ruthenium, iridium, or osmium, substantially absent oxygen. In some embodiments, one of first electrode 202 and second electrode 204 includes osmium oxide and the other includes one of ruthenium, silver, or iridium, substantially absent oxygen.

First electrode 202 and second electrode 204 may be provided at any suitable thicknesses (in the z-dimension) such that their bulk work function values or properties are attained in the thin film layer. In some embodiments, first electrode 202 has a thickness of not less than 5 nm. In some embodiments, first electrode 202 has a thickness of not less than 8 nm. In some embodiments, first electrode 202 has a thickness of not less than 10 nm. In some embodiments, first electrode 202 has a thickness in the range of 10 to 100 nm. In some embodiments, first electrode 202 has a thickness of not less than 100 nm. In some embodiments, first electrode 202 has a thickness in the range of 30 to 50 nm with 40 nm being particularly advantageous. Similarly, in some embodiments, second electrode 204 has a thickness of not less than 5 nm. In some embodiments, second electrode 204 has a thickness of not less than 8 nm. In some embodiments, second electrode 204 has a thickness of not less than 10 nm. In some embodiments, second electrode 204 has a thickness in the range of 10 to 100 nm. In some embodiments, second electrode 204 has a thickness of not less than 100 nm. In some embodiments, second electrode 204 has a thickness in the range of 30 to 50 nm.

Furthermore, as shown, metal layer 205 may be provided on or over second electrode 204. Although illustrated with respect to being on or over second electrode 204, metal layer 205 may, in addition or in the alternative, be applied under first electrode 202 such that it is immediately adjacent first electrode 202. Although illustrated with respect to no intervening material being between metal layer 205 and second electrode 204, in some embodiments, an intervening layer may be employed. In contexts where metal layer 205 is employed, the thickness of second electrode 204 (and/or first electrode 202) may be adjusted. In some embodiments, metal layer 205 has a thickness has a thickness in the range of 10 to 60 nm. In some embodiments, second electrode 204 has a thickness in the range of 30 to 50 nm with 40 nm being particularly advantageous. In such contexts one or both of first electrode 202 and second electrode 204 may have a thickness in the range of about 10 to 30 nm or in the range of 15 to 25 nm with 20 nm being particularly advantageous. Metal layer 205 may include any suitable conductive material (i.e., metal) to couple second electrode 204 and/or first electrode 202 to bottom electrode 129 and/or top electrode 125, respectively. In some embodiments, metal layer 205 includes titanium substantially absent oxygen. For example, metal layer 205 may provide barrier and adhesion layer.

In some embodiments, bottom electrode 129 and top electrode 125 include copper having a thickness in the range of about 200 to 300 nm (e.g., a thickness of about 250 nm) or a thickness in the range of about 5 to 25 microns, first electrode 202 includes iridium and is substantially absent oxygen and has a thickness in the range of about 30 to 50 nm (e.g., a thickness of about 40 nm), dielectric layer 203 includes titanium and oxygen (e.g., titanium oxide) having a thickness in the range of about 30 to 50 nm (e.g., a thickness of about 40 nm), second electrode 204 includes iridium and oxygen (e.g., iridium oxide) having a thickness in the range of about 15 to 25 nm (e.g., a thickness of about 20 nm), and metal layer 205 includes titanium and is substantially absent oxygen and has a thickness in the range of about 30 to 50 nm (e.g., a thickness of about 40 nm); although any materials and characteristics discussed herein may be employed.

As discussed, in some embodiments, first electrode 202 includes a noble metal oxide. In such embodiments, it may advantageous to provide a noble metal layer substantially absent oxygen between first electrode 202 and bottom electrode 129.

Figure 2B:
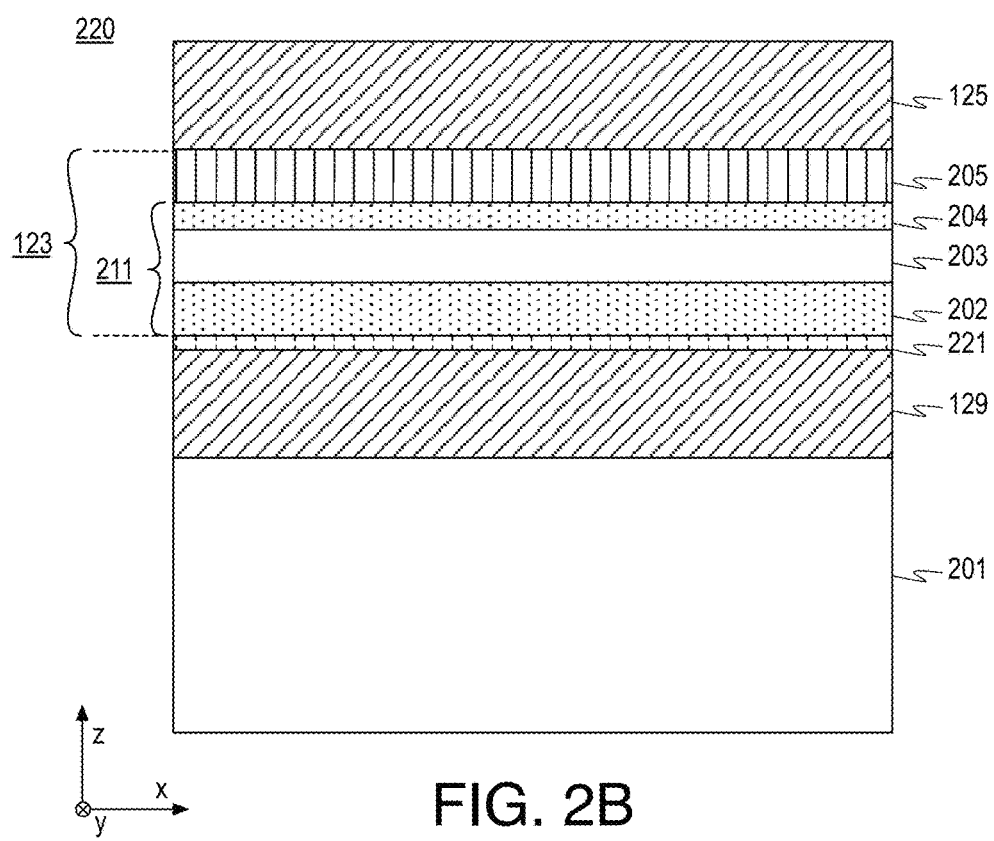
FIG. 2B is an illustration of a cross-sectional view of another thin film capacitor structure including a multilayer capacitor material stack.

FIG. 2B is an illustration of a cross-sectional view of another thin film capacitor structure 220 including multi-layer capacitor material stack 123, arranged in accordance with at least some implementations of the present disclosure. As shown, thin film capacitor structure 220 may include substrate 201, bottom electrode 129 (or bottom conductor), a barrier layer 221, first electrode 202, dielectric layer 203, second electrode 204, metal layer 205, and top electrode 125 (or top conductor). Like components with respect to thin film capacitor structure 200 may have any characteristics discussed herein with respect to FIG. 2A and elsewhere herein.

Notably, in embodiments where first electrode 202 includes a noble metal oxide, it may be advantageous to provide barrier layer 221 on bottom electrode 129 to prevent oxidization of bottom electrode 129 during the formation of the noble metal oxide of first electrode 202. Barrier layer 221 may include any suitable material that prevents or reduces such oxidation. In some embodiments, barrier layer 221 includes the same noble metal as that of the noble metal oxide of first electrode 202 but is absent oxygen. For example, if the noble metal oxide of first electrode 202 is iridium oxide, barrier layer 221 may include iridium substantially absent oxygen. Such configurations may be employed for any noble metal oxide discussed herein. In other embodiments, the material of barrier layer 221 does not match that of the noble metal of the noble metal oxide of first electrode 202. In some embodiments, barrier layer 221 includes any noble metal discussed herein and is substantially absent oxygen. In some embodiments, barrier layer 221 includes palladium and is substantially absent oxygen. In some embodiments, barrier layer 221 includes iridium and is substantially absent oxygen. Barrier layer 221 may have any suitable thickness (in the z-dimension), In some embodiments, barrier layer 221 has a thickness of not less than 3 nm. In some embodiments, barrier layer 221 has a thickness in the range of 3 to 10 nm. In some embodiments, barrier layer 221 has a thickness in the range of 4 to 6 nm. In some embodiments, barrier layer 221 has a thickness of about 5 nm. In some embodiments, barrier layer 221 has a thickness of about 20 nm such as in package substrate applications, where such a thickness provides good film coverage and advantageously higher roughness.

Notably, the techniques discussed herein provide thin film capacitors having a titanium oxide dielectric and one or more conducting noble metal oxide electrodes for improved capacitor performance in a variety of contexts. In some embodiments, the thin film capacitors discussed herein are employed in voltage regulators such as fully integrated voltage regulators for higher efficiency power delivery. The thin film capacitors may be patterned into any geometry required for integration with other devices and they may be fabricated on a die (e.g., a silicon die), package substrate, or motherboard, or they may be into build-up layers of such devices (e.g., in build-up layers of an electronic package substrate or on any other substrate.

Figure 3:
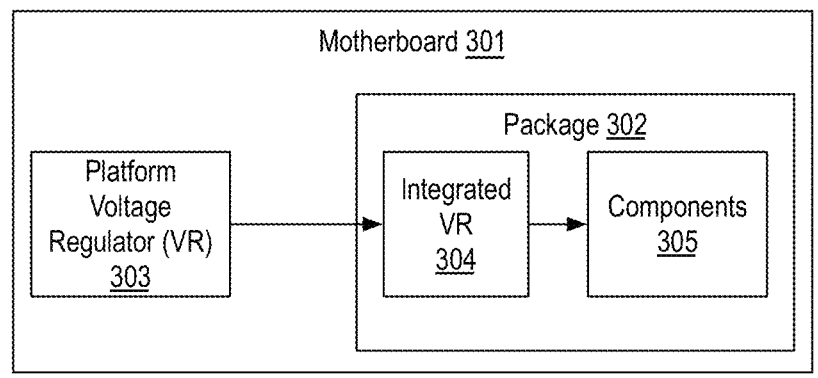
FIG. 3 is an illustration of a system employing one or more thin film capacitors having a material stack with a titanium oxide dielectric layer and at least one conducting noble metal oxide electrode.

FIG. 3 is an illustration of a system 300 employing one or more thin film capacitors having a material stack with a titanium oxide dielectric layer and at least one conducting noble metal oxide electrode, arranged in accordance with at least some implementations of the present disclosure. As shown, system 300 includes a motherboard 301 (or platform), a platform voltage regulator (VR) 303, and a package 302 that includes an integrated VR 304, and one or more components 305. For example, package 302 may implement semiconductor package 100 such that components 305 include one or more of components 135.

Notably, any, some, or all components of system 300 may include or employ thin film capacitor structure 200, one or more portions of thin film capacitor structure 200 (e.g., multilayer capacitor material stack 123 or multilayer capacitor material stack 211). In some embodiments, platform VR 303 provides voltage regulation for motherboard 301 and may provide a step down in voltage from, for example, 12 V to 5 V such that package 302, via integrated VR 304, receives input voltage at 5 V. In some embodiments, a thin film capacitor as discussed herein may provide a decoupling capacitor (e.g., for supply current during transient spikes in demand and to minimize noise) for platform VR 303. In a similar manner, integrated VR 304 provides voltage regulation for package 302 and may provide a step down in voltage from, for example, 5 V to 0.9 V such that one or more components 135 (e.g., integrated circuit die) receives input voltage at 0.9 V. In some embodiments, a thin film capacitor as discussed herein may provide a decoupling capacitor for integrated VR 304. In addition or in the alternative, one or more components 135 may employ a thin film capacitor as discussed herein for internal power supply, voltage regulation, or the like.

In some embodiments, system 300 includes a power supply, a package substrate (e.g., package 302), an integrated circuit die (e.g., component 135), and a thin film capacitor in the package substrate such that thin film capacitor includes a dielectric layer including titanium and oxygen between first and second electrodes, and such that one or both of the first electrode or the second electrode includes a noble metal and oxygen. The thin film capacitor may include any characteristics discussed herein with respect to thin film capacitors, thin film capacitor structures, etc. Furthermore, in some embodiments, the thin film capacitor is a component of a power delivery circuit (or voltage regulator circuit), the first electrode includes the noble metal and oxygen and the second electrode includes the noble metal and is substantially absent oxygen, and the first electrode is to be negatively biased in operation of the power delivery circuit. For example, a thin film capacitor may only be biased in one direction such that the lowest leakage bias direction is used. In some embodiments, the lowest leakage bias direction is negative with a noble metal oxide second electrode 204 (top electrode), meaning negative charge is on the noble metal oxide top contact. Such biasing may permit a 5 V bias with leakage below acceptable limits.

As discussed, thin film capacitors employed using the techniques discussed herein include a material stack with a titanium oxide dielectric layer and at least one conducting noble metal oxide electrode. In some embodiments, the noble metal oxide electrode is in direct contact with the titanium oxide dielectric, which improves the stability of the titanium oxide film for reduced leakage current after subsequent processing such as ball attach reflow processing or other processing, which may otherwise degrade performance. In some embodiments, titanium oxide is deposited on an iridium first (bottom) electrode and the capacitor includes an iridium oxide second (top) electrode.

Figure 4:
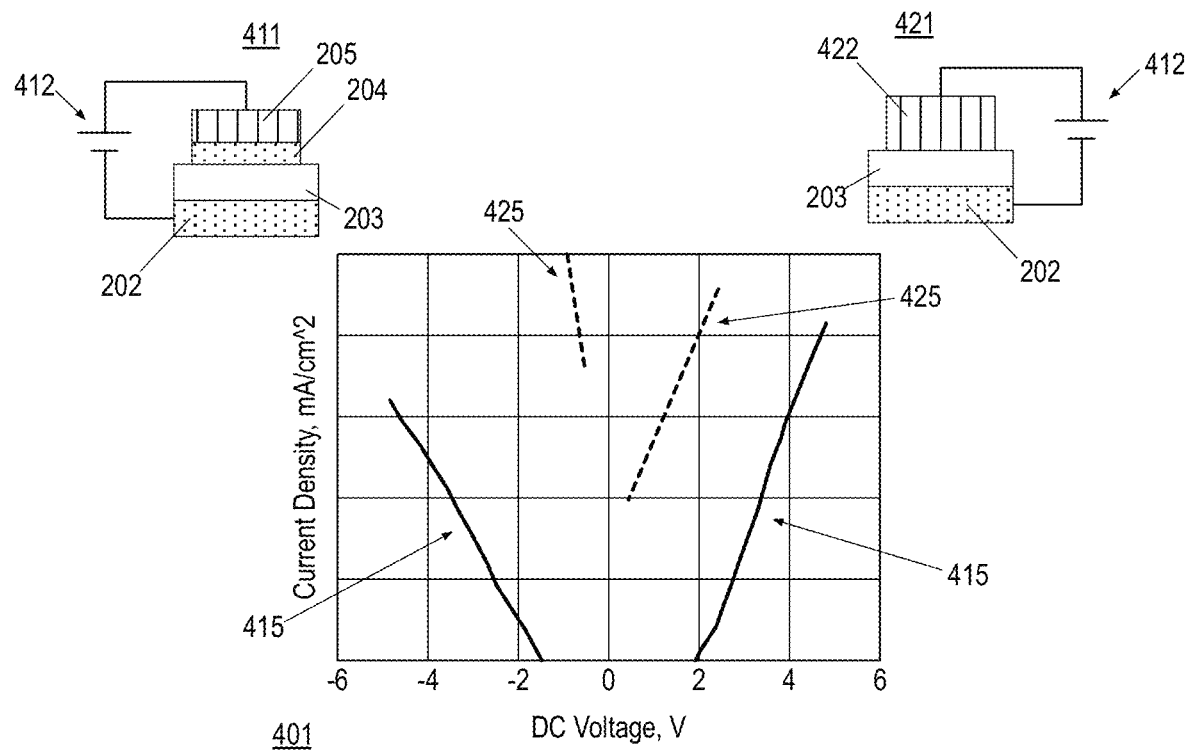
FIG. 4 is an illustration of an example leakage current versus voltage plot after reflow processing comparing thin film capacitors including and excluding a conducting noble metal oxide electrode.

FIG. 4 is an illustration of an example leakage current versus voltage plot 401 after reflow processing comparing thin film capacitors including and excluding a conducting noble metal oxide electrode, arranged in accordance with at least some implementations of the present disclosure. As shown, leakage current versus voltage plot 401 plots current density (mA/cm^2) (increasing moving up plot 401) versus direct current (DC) voltage (V). Also as shown, current versus voltage curves 415 are provided for a thin film capacitor 411 that includes first electrode 202, dielectric layer 203, second electrode 204, and metal layer 205 using a material system discussed herein such that second electrode 204 includes a noble metal oxide and first electrode 202 includes a noble metal and is substantially absent oxygen. Similarly, current versus voltage curves 425 are provided for a thin film capacitor 421 that includes first electrode 202 and dielectric layer 203 using the same materials as thin film capacitor but is absent second electrode 204 and instead includes a metal layer 422, that includes the same material as metal layer 205 (e.g., palladium, Pd) approximately at a combined thickness of thicknesses of second electrode 204 and metal layer 205.

As shown, after processing subsequent to that used to form thin film capacitors 411, 421 such as reflow processing, under both positive and negative bias as applied by voltage source 412, thin film capacitor 411 has much lower current density (i.e., leakage) at the same applied voltages. Notably, thin film capacitor 411 has acceptable leakage current even at higher biases while thin film capacitor 421 breaks down under such conditions. As discussed, FIG. 4 illustrates leakage current density versus voltage under positive and negative bias comparing a thin film capacitor with a noble metal oxide (NMOx) top electrode (i.e., second electrode 204) to a thin film capacitor with a top electrode having a metal (e.g., palladium) absent oxygen. It is noted that the noble metal oxide (NMOx) top electrode also increases capacitance density relative to top electrode having a metal (e.g., palladium) absent oxygen. Furthermore, leakage current in thin film capacitor 411 or any other thin film capacitor or thin film capacitor structure discussed herein may be driven lower via the titanium oxide dielectric layer application process and thickness tuning with a tradeoff in capacitance density.

Discussion now turns to methods for forming thin film capacitors having a titanium oxide dielectric and one or more noble metal oxide electrodes.

Figure 5:
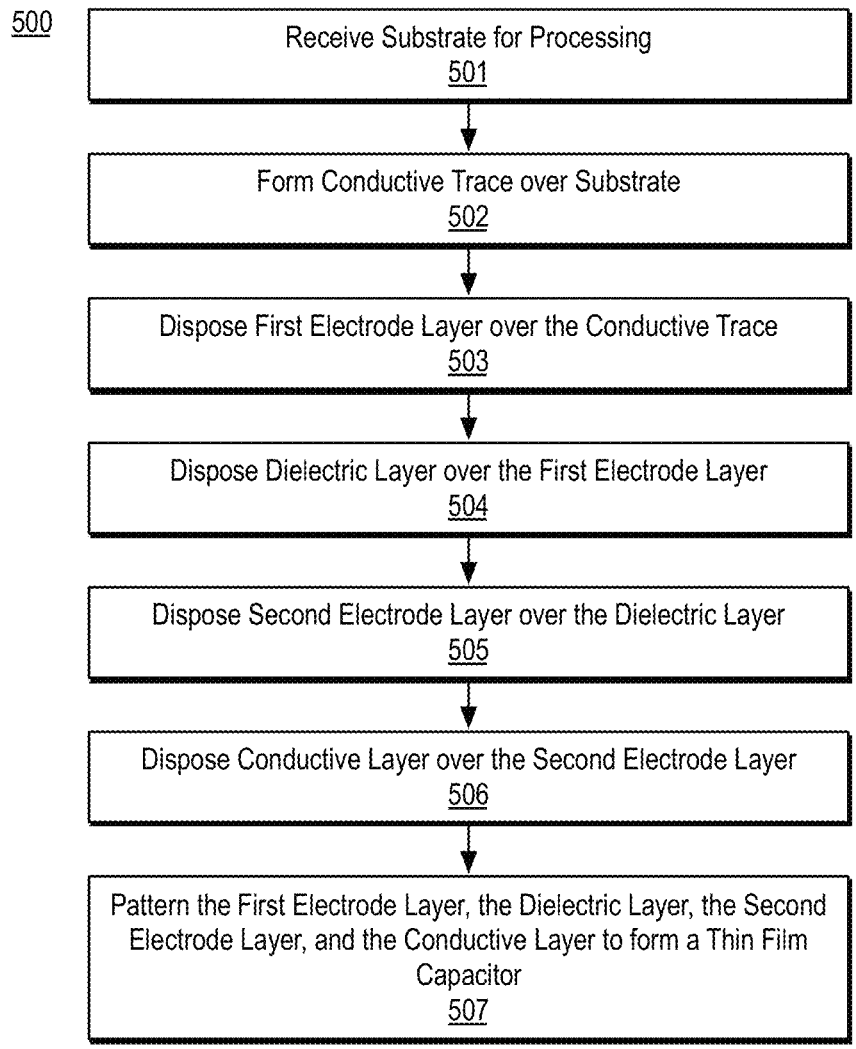
FIG. 5 is a flow diagram illustrating methods 500 for forming thin film capacitor structures.

FIG. 5 is a flow diagram illustrating methods 500 for forming thin film capacitor structures, arranged in accordance with at least some implementations of the present disclosure. For example, methods 500 may be employed to form thin film capacitor structures in in an electronic package substrate. FIGS. 6A, 6B, 6C, 6D, 6E, 6F, and 6G are cross-sectional views of exemplary thin film capacitor structures as selected fabrication operations in methods 500 are performed, arranged in accordance with at least some implementations of the present disclosure. FIGS. 7A, 7B, 7C, 7D, 7E, 7F, 7G, 7H, and 7I are cross-sectional views of exemplary thin film capacitor structures as selected fabrication operations in methods 500 are performed, arranged in accordance with at least some implementations of the present disclosure. For example, FIGS. 7A-7G provide a similar processing to FIGS. 6A-7G with a thinner top metal layer and less capacitor layer shown across the width. Furthermore, FIGS. 7H and 7I provide additional operations for providing interconnects for the thin film capacitor structures, which may also be applied after the thin film capacitor structure of FIG. 7G.

As shown in FIG. 5, methods 500 begin at operation 501, where a substrate (e.g., a work piece) is received for processing. The received substrate may be a partially fabricated structure that may be formed on a substrate such as a substrate board or substrate wafer. A device layer may be previously formed within, on, and/or over the substrate. The device layer may include any devices such as transistors, memory devices, capacitors, resistors, optoelectronic devices, switches, or any other active or passive electronic devices. The received substrate may further include one or more metallization layers over the device layer. In some embodiments, no metallization layers are formed over the device layer. Such devices and metallization layer(s) may be formed using any suitable technique or techniques known in the art.

Processing continues at operation 502, where a conductive layer is formed over the substrate. The conductive layer may be formed over the substrate using any suitable technique or techniques. In some embodiments, the conductive layer is formed by providing a bulk layer (e.g., via electroplating) over the substrate and patterning using lithography and etch techniques. In some embodiments, the conductive layer is a copper layer that is a part of a metallization layer and forms a pad or electrode for a thin film capacitor.

Processing continues at operation 503, where a first electrode layer is formed or disposed over the conductive layer. For example, the first electrode layer may be a bulk conformal layer. The first electrode layer may be formed using any suitable technique or techniques and may include any material, materials, or characteristics discussed with respect to first electrode 202. In some embodiments, the first electrode layer is formed using sputtering or co-reactive sputtering techniques. In embodiments where first electrode layer includes a noble metal oxide (i.e., a noble metal element and oxygen), co-reactive sputtering techniques may be employed such that a target including the noble metal is sputtered into a plasma containing oxygen. However, other techniques such as co-evaporative deposition techniques may be employed. In some embodiments, forming the first electrode layer is advantageously performed at a temperature of not greater than 215° C. Furthermore, in embodiments where the first electrode layer includes a noble metal oxide, a barrier layer having any characteristics discussed with respect to barrier layer 221 may be formed using any suitable technique or techniques such as sputter deposition, or electroplating techniques.

Processing continues at operation 504, where a dielectric layer including titanium and oxygen (i.e., titanium oxide) is formed over the first electrode layer. For example, the dielectric layer may be a bulk conformal layer. The dielectric layer may be formed using any suitable technique or techniques and may include characteristics discussed with respect to dielectric layer 203. In some embodiments, the dielectric layer is formed using sputtering or vapor deposition techniques.

Processing continues at operation 505, where a second electrode layer is formed over the dielectric layer. For example, the second electrode layer may be a bulk conformal layer. The second electrode layer may be formed using any suitable technique or techniques and may include any material, materials, or characteristics discussed with respect to second electrode 204. In some embodiments, the second electrode layer is formed using sputtering or co-reactive sputtering techniques. In embodiments where second electrode layer includes a noble metal oxide, co-reactive sputtering techniques may be employed as discussed with respect to operation 503. In some embodiments, forming the first electrode layer is advantageously performed at a temperature of not greater than 215° C.

Processing continues at operation 506, where a conductive layer is formed over the second electrode layer. For example, the conductive layer may be a bulk conformal layer. The conductive layer may be formed using any suitable technique or techniques and may include any material, materials, or characteristics discussed with respect to metal layer 205. In some embodiments, the conductive layer is formed using sputtering or electroplating techniques.

Processing continues at operation 507, where the first electrode layer, the dielectric layer, the second electrode layer, and the conductive layer (and a barrier layer if employed) are patterned to form a thin film capacitor having any suitable shape and geometry. The discussed layers may be patterned using any suitable technique or techniques such as lithography and etch techniques. The thin film capacitor may have any characteristics discussed herein and may be formed over any substrate.

Process 500 may further include contacting the thin film capacitor via a second conductive layer and further providing routing (e.g., using vias and metallization layers) to the thin film capacitor. Additional routing for system circuitry may be provided by package interconnects, bonds, and so on. Thereby, the formed thin film capacitor may be included in any suitable circuitry.

FIG. 6A illustrates an example thin film capacitor structure 600 including a build up layer 601. For example, build up layer 601 may be a top or exposed layer of a package substrate. Although illustrated with respect to forming thin film capacitor structures on build up layer 601 or a package substrate, as discussed, the thin film capacitor structures herein may be formed over any suitable substrate such as a silicon wafer substrate (including devices formed therein), a motherboard or platform substrate, or the like.

FIG. 6B illustrates an example thin film capacitor structure 602 similar to thin film capacitor structure 600, after the formation of vias 603 in build up layer 601 and a bottom electrode 605 and pad 697. Vias 603 may be formed using any suitable technique or techniques such as drilling through build up layer 601, patterning and etch techniques, or the like. Bottom electrode 605 and pad 697 may also be formed using any suitable technique or techniques such as depositing a metal layer on build up layer 601 and in vias 603 and patterning the metal layer using lithography and etch techniques. In some embodiments, bottom electrode 605 and pad 697 are formed using semi-additive processing.

FIG. 6C illustrates an example thin film capacitor structure 604 similar to thin film capacitor structure 602, after the formation of a material stack 607 including a first electrode layer 631, a dielectric layer 632, a second electrode layer 633, and an optional metal layer 634, which may be collectively characterized as a thin film transistor material stack. In embodiments where first electrode layer 631 includes a noble metal oxide, material stack 607 may include a barrier layer (not shown in FIG. 6C) such that the barrier layer is at the bottom of material stack 607 and first electrode layer 631 is on the barrier layer as discussed with respect to FIG. 2B.

First electrode layer 631 may be formed using any suitable technique or techniques and may include any material, materials, or characteristics discussed with respect to first electrode 202. In some embodiments, first electrode layer 631 is formed using sputtering or co-reactive sputtering techniques as discussed with respect to operation 503. Dielectric layer 632 includes titanium oxide and may include characteristics discussed with respect to dielectric layer 203. Dielectric layer 632 may be formed using any suitable technique or techniques such as sputtering or vapor deposition techniques. Second electrode layer 633 may be formed using any suitable technique or techniques and may include any material, materials, or characteristics discussed with respect to second electrode 204. In some embodiments, second electrode layer 633 is formed using sputtering or co-reactive sputtering techniques as discussed with respect to operation 505. Metal layer 634 may be formed using any suitable technique or techniques and may include any material, materials, or characteristics discussed with respect to metal layer 205. In some embodiments, metal layer 634 is formed using sputtering or electroplating techniques.

FIG. 6D illustrates an example thin film capacitor structure 606 similar to thin film capacitor structure 604, after the formation of a conductive layer 613. Conductive layer 613 may include any suitable metal material for a conductive electrode or layer such as copper or the like. Conductive layer 613 may be formed using any suitable technique or techniques such as electroplating or deposition techniques.

FIG. 6E illustrates an example thin film capacitor structure 608 similar to thin film capacitor structure 606, after the formation of a photoresist pattern 615 over conductive layer 613. For example, a bulk photoresist material may be deposited and pattered using photolithography techniques to provide photoresist pattern 615. Although discussed with respect to photolithography techniques any patterning techniques may be employed.

FIG. 6F illustrates an example thin film capacitor structure 610 similar to thin film capacitor structure 608, after the patterning of conductive layer 613 and material stack 607 (inclusive of an optional barrier layer, first electrode layer 631, dielectric layer 632, second electrode layer 633, and optional metal layer 634) to form a thin film capacitor 699 that includes conductive layer 613 (formed into a top electrode or top electrode layer), bottom electrode 605 and remaining portions of material stack 607 such that thin film capacitor 699 includes a titanium oxide dielectric layer between first and second electrodes, one or both of which include a noble metal oxide as discussed herein, and to form a landing surface 621. Furthermore, photoresist pattern 615 may be removed using any suitable technique or techniques such as resist ash techniques.

FIG. 6G illustrates an example thin film capacitor structure 612 similar to thin film capacitor structure 610, after the formation of a build up layer 617 and via openings 619A, B, C. As shown, build-up layer 617 may be positioned (e.g., laminated, etc.) on exposed surfaces of bottom electrode 605, material stack 607, conductive layer 613, build-up layer 601, and pad 697. Subsequently, via openings 619A, B, C are formed such that via opening 619A is on or over top electrode 613, via opening 619B is on or over bottom electrode 605, and via opening 619C is on or over the pad 697. Additional processing operations may be performed following formation of the via openings 619A-C inclusive of filling the via openings 619A-C with conductive until a substrate having any number of layers is formed. The resultant substrate may be bonded to a component as shown with respect to FIG. 1 herein. Although illustrated with respect to package build up layers, in some embodiments, such build up is provided using bulk dielectric deposition, patterning and etch techniques, and the like.

Figure 7A:
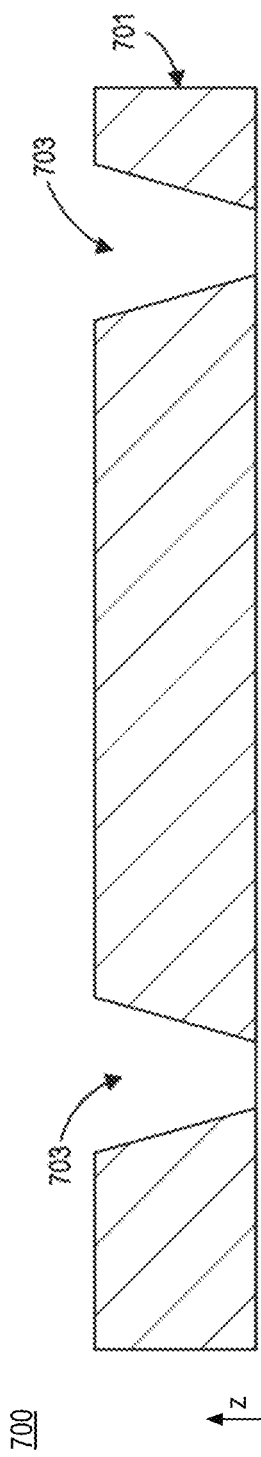

FIG. 7A illustrates an example thin film capacitor structure 700 including a build up layer 701 having via openings 703 therein in analogy to FIG. 6B above. Although illustrated with respect to forming thin film capacitor structures on build up layer 701 or a package substrate, as discussed, the thin film capacitor structures herein may be formed over any suitable substrate such as a silicon wafer substrate (including devices formed therein), a motherboard or platform substrate, or the like. Vias 703 may be formed using any suitable technique or techniques such as drilling through build up layer 701, patterning and etch techniques, or the like.

Figure 7B:
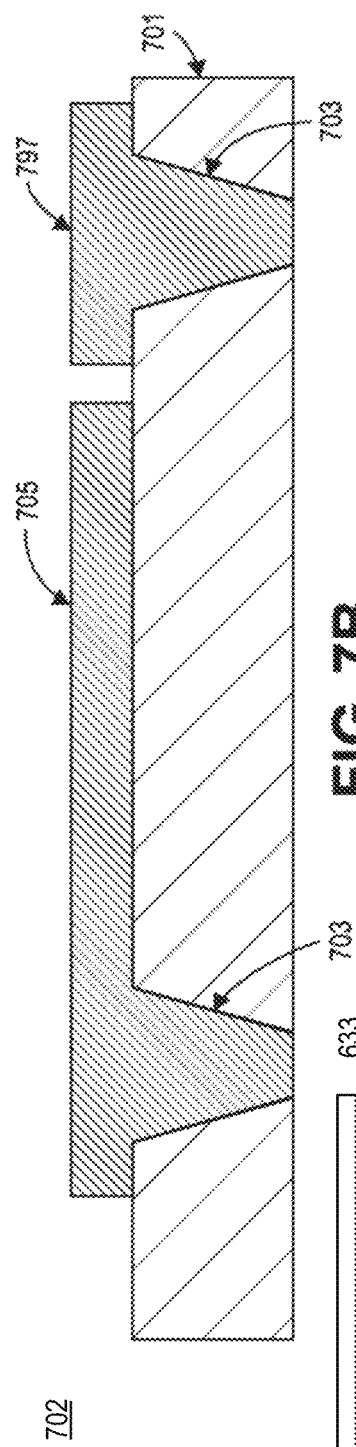

FIG. 7B illustrates an example thin film capacitor structure 702 similar to thin film capacitor structure 700, after the formation bottom electrode 705 and pad 797. Bottom electrode 705 and pad 797 may be formed using any suitable technique or techniques such as depositing a metal layer on build up layer 701 and in vias 703 and patterning the metal layer using lithography and etch techniques. In some embodiments, bottom electrode 705 and pad 797 are formed using semi-additive processing.

Figure 7C:
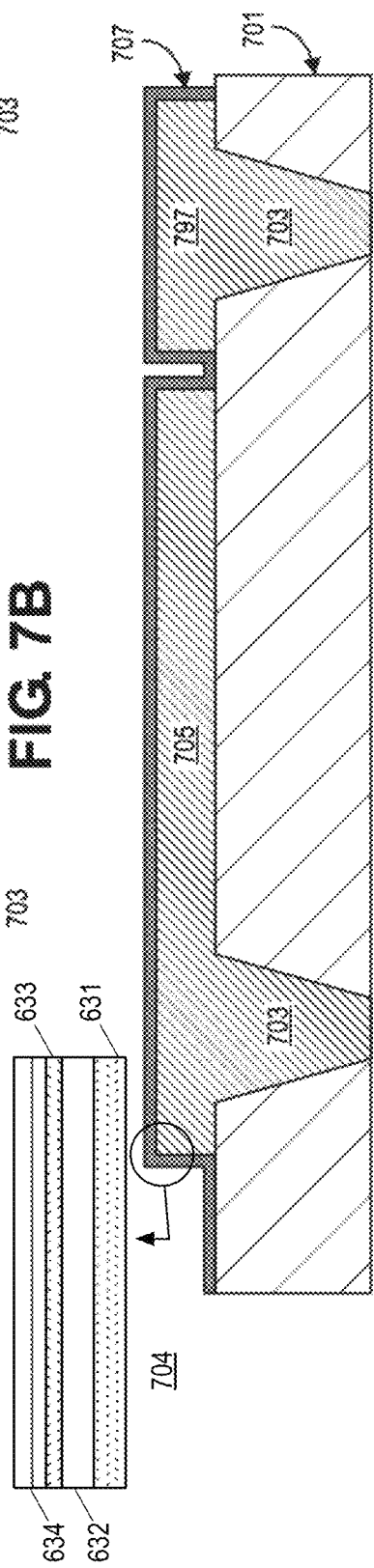

FIG. 7C illustrates an example thin film capacitor structure 704 similar to thin film capacitor structure 702, after the formation of a material stack 707 including first electrode layer 631, dielectric layer 632, second electrode layer 633, and optional metal layer 634, which may be collectively characterized as a thin film transistor material stack. Material stack 707 and the components thereof may be formed using the techniques and have any characteristics as discussed with respect to FIG. 6C or elsewhere herein. In embodiments where first electrode layer 631 includes a noble metal oxide, material stack 707 may include a barrier layer such that the barrier layer is at the bottom of material stack 707 and first electrode layer 631 is on the barrier layer as discussed herein. As discussed, first electrode layer 631 may include any material, materials, or characteristics discussed with respect to first electrode 202, dielectric layer 632 includes titanium oxide and may include characteristics discussed with respect to dielectric layer 203, second electrode layer 633 may include any material, materials, or characteristics discussed with respect to second electrode 204, and optional metal layer 205 may include any material, materials, or characteristics discussed with respect to metal layer 205.

Figure 7D:
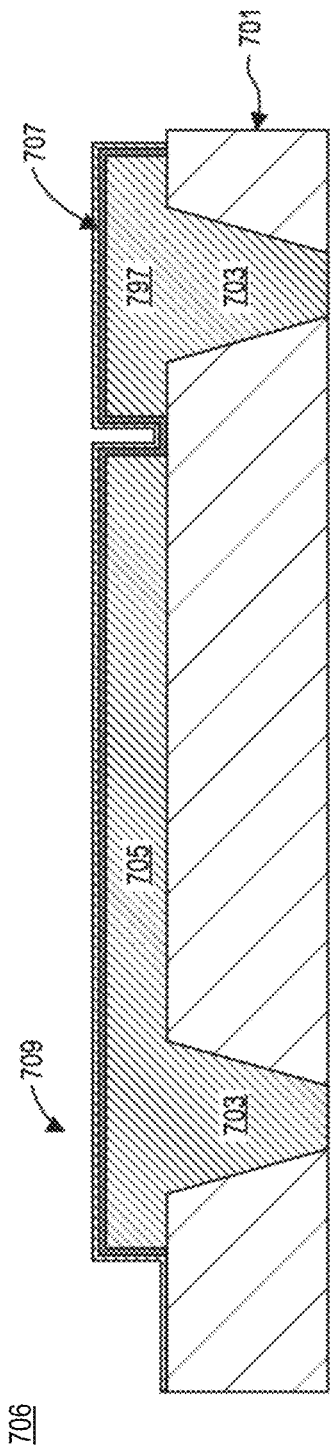

FIG. 7D illustrates an example thin film capacitor structure 706 similar to thin film capacitor structure 704, after the formation of a conductive layer 709. Conductive layer 709 may be formed using any suitable technique or techniques such as electroplating or deposition techniques. Conductive layer 709 may include any suitable metal material for a conductive electrode or layer such as copper or the like.

Figure 7E:
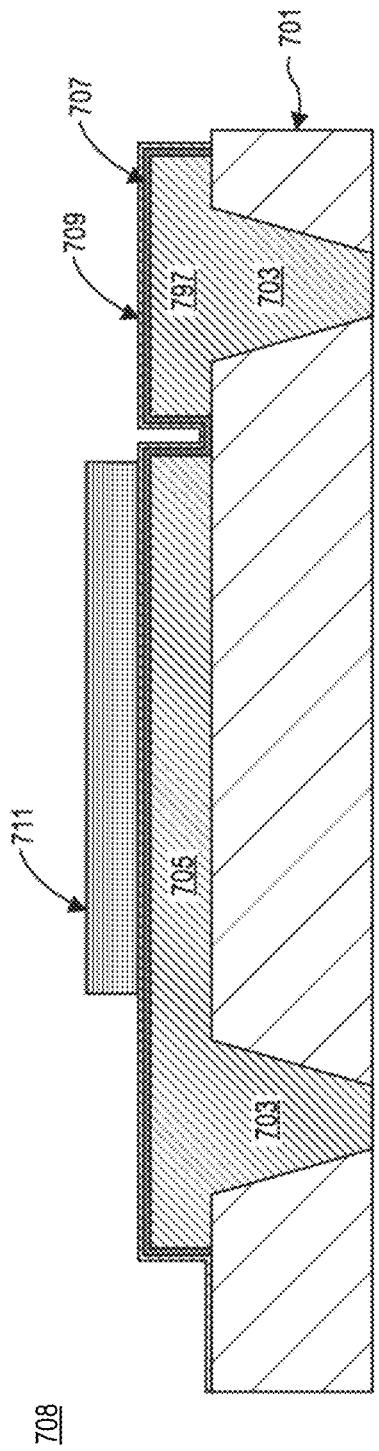
Figure 7H:
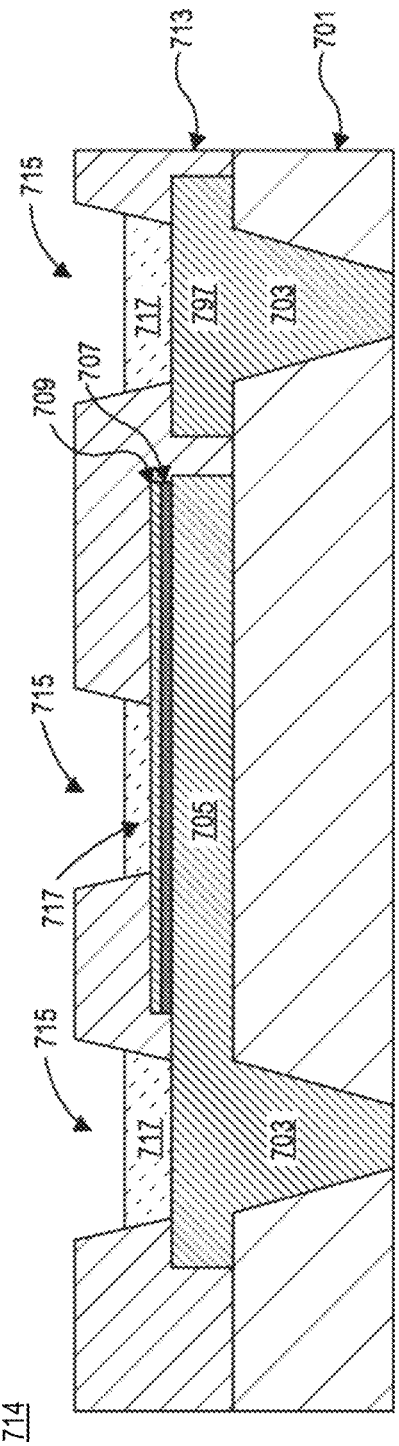
Figure 7I:
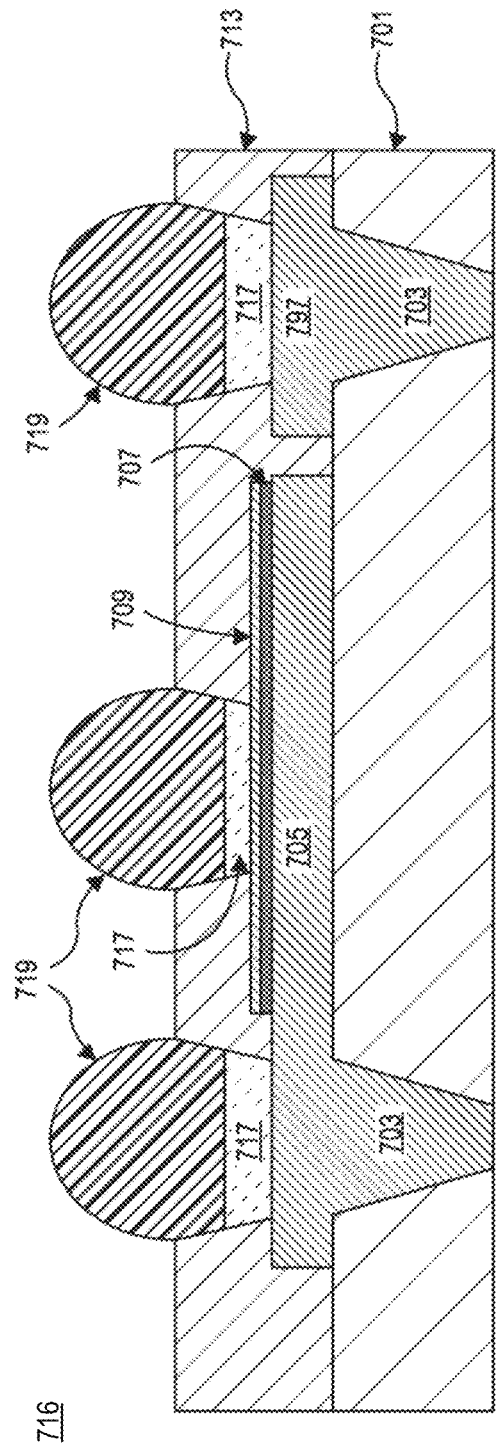

FIG. 7E illustrates an example thin film capacitor structure 708 similar to thin film capacitor structure 706, after the formation of a photoresist pattern 711 over conductive layer 709. For example, a bulk photoresist material may be deposited and pattered using photolithography techniques to provide photoresist pattern 711. Although discussed with respect to photolithography techniques any patterning techniques may be employed.

FIG. 7F illustrates an example thin film capacitor structure 710 similar to thin film capacitor structure 708, after the patterning of conductive layer 709 and material stack 707 (inclusive of an optional barrier layer, first electrode layer 631, dielectric layer 632, second electrode layer 633, and optional metal layer 634) to form a thin film capacitor 799 that includes conductive layer 709 (formed into a top electrode or top electrode layer), bottom electrode 705 and remaining portions of material stack 707 such that thin film capacitor 699 includes a titanium oxide dielectric layer between first and second electrodes, one or both of which include a noble metal oxide as discussed herein.

FIG. 7G illustrates an example thin film capacitor structure 712 similar to thin film capacitor structure 710, after the removal of photoresist pattern 711 and after the formation of a solder resist layer 713 having via openings 715. For example, solder resist layer 713 may be laminated, on exposed surfaces of bottom electrode layer 705, conductive layer 709, build-up layer 701, material stack 707, and pad 797, and subsequently patterned to form via openings 715 that expose a surface of the bottom electrode layer 705, a surface of the conductive layer 709, and a surface of the pad 797.

FIG. 7H illustrates an example thin film capacitor structure 714 similar to thin film capacitor structure 712, after formation of a surface finish 717 on the exposed surfaces of bottom electrode layer 705, conductive layer 709, and pad 797 and within via opening 715. Surface finish 717 may be formed using any suitable technique or techniques known in the art.

FIG. 7I illustrates an example thin film capacitor structure 716 similar to thin film capacitor structure 714, after the formation of interconnects 719. Although illustrated with respect to bumps, interconnects 719 may be any suitable interconnect structures such as pillars, posts, or the like. Such interconnects 719 may be formed using any suitable technique or techniques known in the art.

Figure 8:
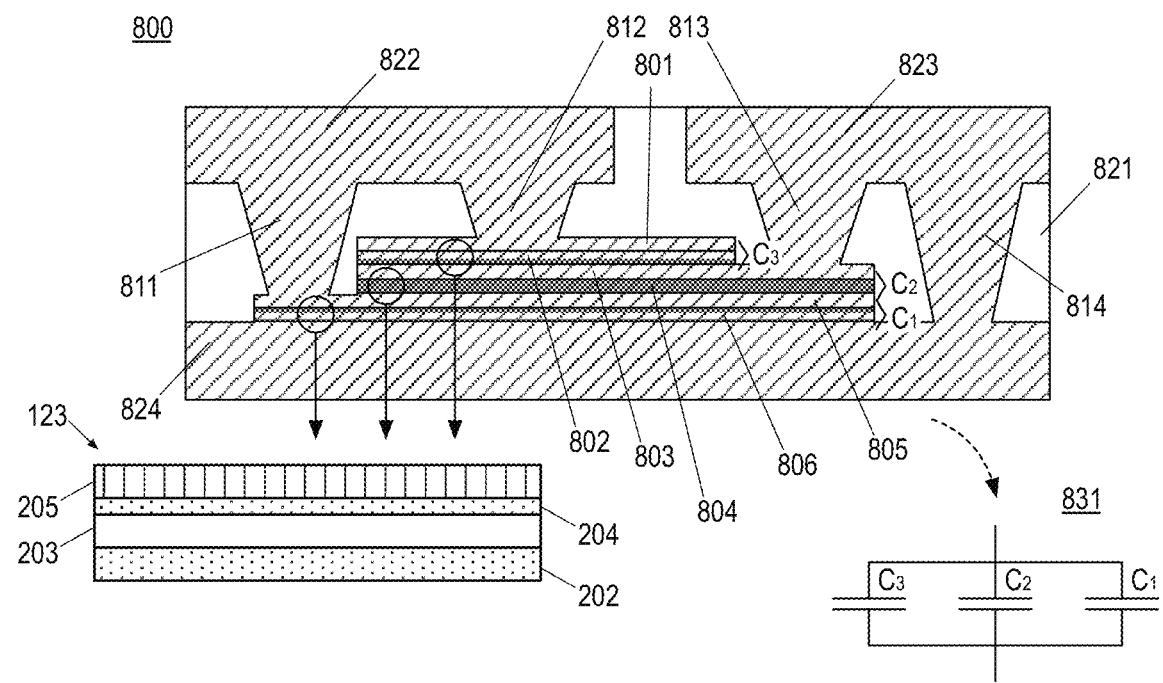
FIG. 8 is an illustration of an example multi-layer thin film capacitor circuit.

FIG. 8 is an illustration of an example multi-layer thin film capacitor circuit 800, arranged in accordance with at least some implementations of the present disclosure. Notably, the thin film capacitor structures discussed herein may be formed as a single capacitor layer or with multiple layers for increased capacitance density. As shown, multi-layer thin film capacitor circuit 800 provides circuitry, as shown with respect to circuit diagram 831 such that a total capacitance ($C_{total}$) provided by multi-layer thin film capacitor circuit 800 is a sum of capacitances ($C_{total}=C_1+C_2+C_3$) of each layer of multi-layer thin film capacitor circuit 800.

Also as shown, multi-layer thin film capacitor circuit 800 comprises three multilayer capacitor material stacks 802, 804, 806, which may have any characteristics as discussed herein with respect to multilayer capacitor material stack 123 and/or multilayer capacitor material stack 211. In embodiments where first electrode 202 includes a noble metal oxide, barrier layer 221 may be provided under first electrode 202. as discussed herein. Furthermore, multi-layer thin film capacitor circuit 800 includes metal layers or electrodes 801, 803, 805 to provide coupling circuitry for multi-layer thin film capacitor circuit 800. Such metal layers or electrodes 801, 803, 805 are coupled to vias 811, 812, 813, respectively and metal interconnects 822, 823, 824 (optionally with via 814) interconnect multilayer capacitor material stacks 802, 804, 806 to form capacitors $C_1$, $C_2$, and $C_3$ of multi-layer thin film capacitor circuit 800. Such components may be embedded within a dielectric or build up layer 821, as shown. Although illustrated with respect to three multilayer capacitor material stacks 802, 804, 806, any number may be employed. Furthermore, multilayer capacitor material stacks 802, 804, 806 may include the same material systems or they may be different.

Figure 9:
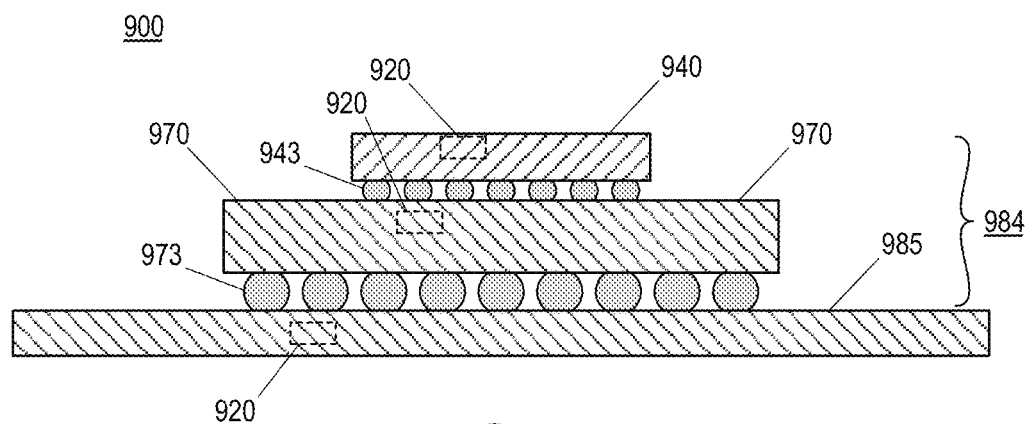
FIG. 9 is an illustration of a cross-sectional side view of a packaged system.

FIG. 9 is an illustration of a cross-sectional side view of a packaged system 900, arranged in accordance with at least some implementations of the present disclosure. As shown, packaged system 900 includes a semiconductor package 984 mounted to a board 985 (e.g., a PCB, motherboard, platform, etc.). Furthermore, semiconductor package 984 includes a package substrate 970 and a component 940 such as one or more dies, one or more die stacks mounted to package substrate 970. In some embodiments, package 984 comprises components that are similar to or the same as the components described above in connection with semiconductor package 100. In some embodiments, package 984 includes a package substrate 970 that includes one or more thin film capacitors 920. Thin film capacitors 920 may include any characteristics, material stacks, and so on discussed elsewhere herein. Furthermore, component 940 as mounted to package substrate 970 may include one or more thin film capacitors 920. As shown, component 940 may be electrically coupled to package substrate 970 using interconnects 943.

Furthermore, semiconductor package 984 may be electrically coupled to a board 985 via interconnects 973 such as balls (as shown), pillars, or any other suitable interconnect architecture, such as wire bonding, ball grid array, pin grid array, land grid array, etc. Also as shown, board 985 may include one or more thin film capacitors 920. As shown in FIG. 9, thin film capacitors 920 may be employed in one, some, or all of board 985, package substrate 970, and component 940. Thereby, the discussed thin film capacitor structures may be advantageously used at any level in a system architecture for improved performance.

Figure 10:
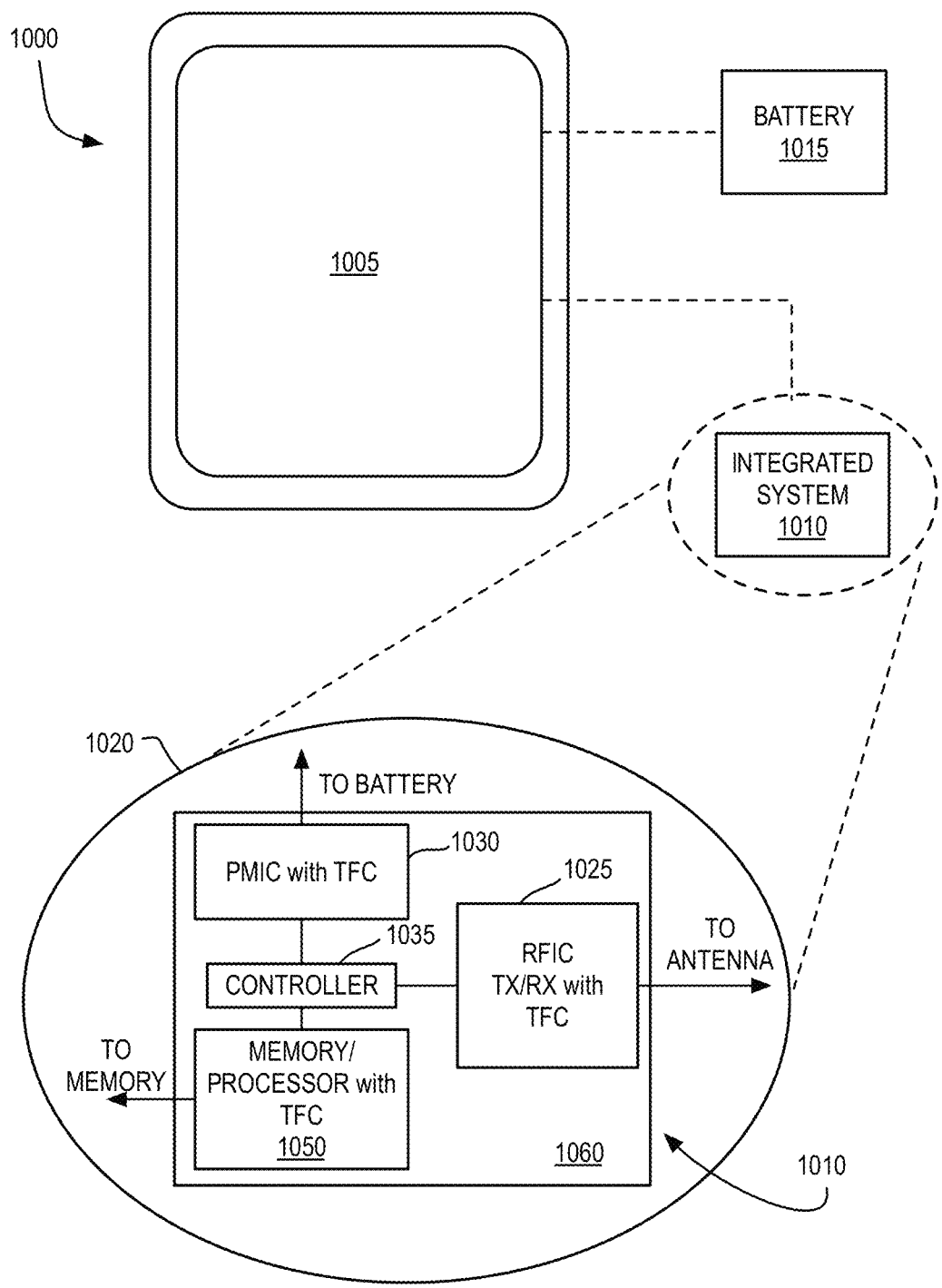
FIG. 10 is an illustrative diagram of a mobile computing platform employing a device having a thin film capacitor.

FIG. 10 is an illustrative diagram of a mobile computing platform 1000 employing a device having a thin film capacitor, arranged in accordance with at least some implementations of the present disclosure. Any die or device having a thin film capacitor inclusive of any components, materials, or characteristics discussed herein may be implemented by any component of mobile computing platform 1000. Mobile computing platform 1000 may be any portable device configured for each of electronic data display, electronic data processing, wireless electronic data transmission, or the like. For example, mobile computing platform 1000 may be any of a tablet, a smart phone, a netbook, a laptop computer, etc. and may include a display screen 1005, which in the exemplary embodiment is a touchscreen (e.g., capacitive, inductive, resistive, etc. touchscreen), a chip-level (system on chip—SoC) or package-level integrated system 1010, and a battery 1015. Battery 1015 may include any suitable device for providing electrical power such as a device consisting of one or more electrochemical cells and electrodes to couple to an outside device. Mobile computing platform 1000 may further include a power supply to convert a source power from a source voltage to one or more voltages employed by other devices of mobile computing platform 1000.

Integrated system 1010 is further illustrated in the expanded view 1020. In the exemplary embodiment, packaged device 1050 (labeled "Memory/Processor" in FIG. 10) includes at least one memory chip (e.g., RAM), and/or at least one processor chip (e.g., a microprocessor, a multi-core microprocessor, or graphics processor, or the like). In an embodiment, the package device 1050 is a microprocessor including an SRAM cache memory. As shown, device 1050 may employ a die or device having any thin film capacitor structures and/or related characteristics discussed herein. Packaged device 1050 may be further coupled to (e.g., communicatively coupled to) a board, a substrate, or an interposer 1060 along with, one or more of a power management integrated circuit (PMIC) 1030, RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path), and a controller 1035 thereof. In general, packaged device 1050 may be also be coupled to (e.g., communicatively coupled to) display screen 1005. As shown, one or both of PMIC 1030 and RFIC 1025 may employ a die or device having any thin film capacitor structures and/or related characteristics discussed herein.

Functionally, PMIC 1030 may perform battery power regulation, DC-to-DC conversion, etc., and so has an input coupled to battery 1015 and with an output providing a current supply to other functional modules. In an embodiment, PMIC 1030 may perform high voltage operations. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 1050 or within a single IC (SoC) coupled to the package substrate of the packaged device 1050.

Figure 11:
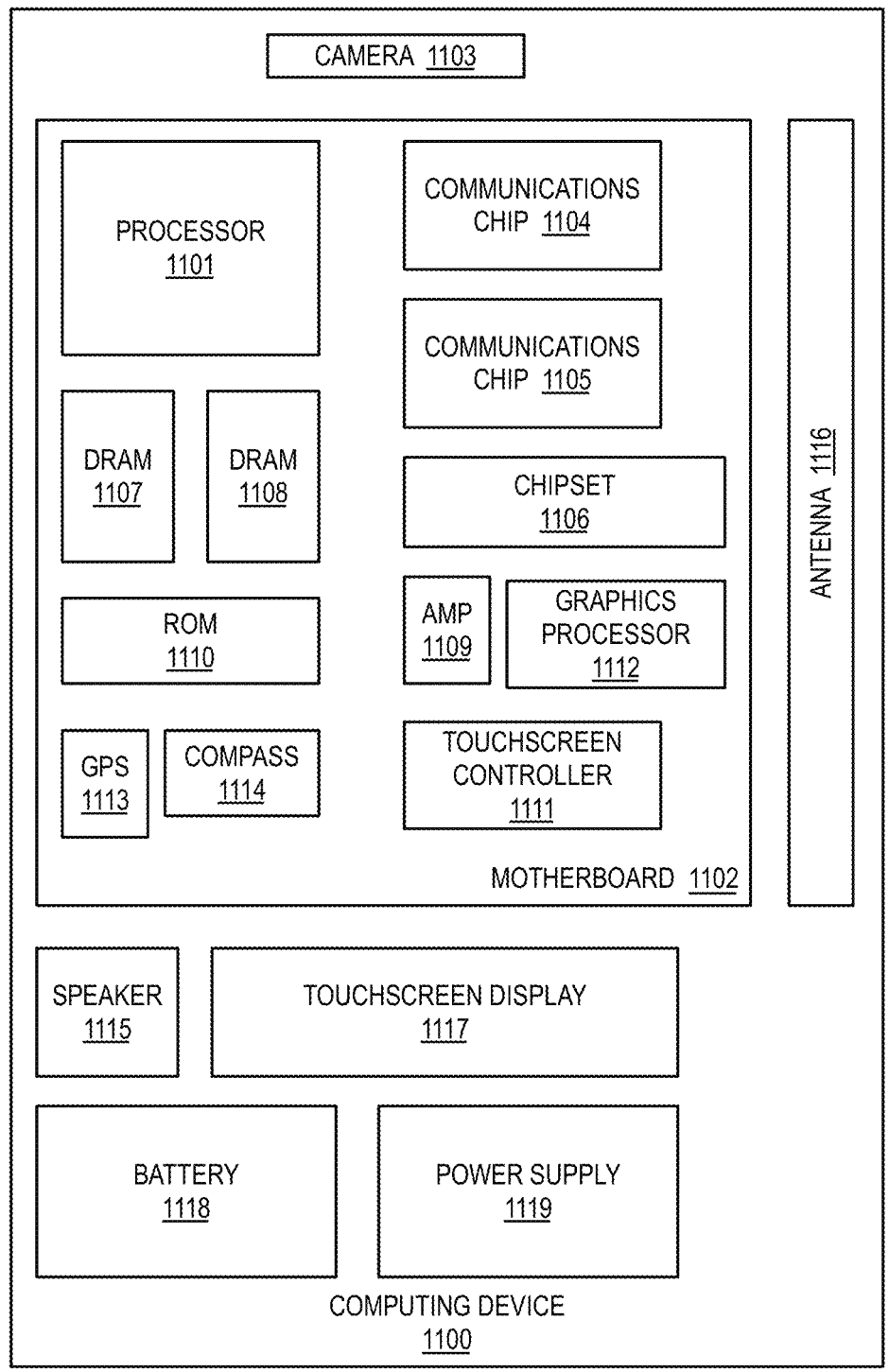
FIG. 11 is a functional block diagram of a computing device, all arranged in accordance with at least some implementations of the present disclosure.

FIG. 11 is a functional block diagram of a computing device 1100, arranged in accordance with at least some implementations of the present disclosure. Computing device 1100 may be found inside platform 1000, for example, and further includes a motherboard 1102 hosting a number of components, such as but not limited to a processor 1101 (e.g., an applications processor) and one or more communications chips 1104, 1105. Processor 1101 may be physically and/or electrically coupled to motherboard 1102. In some examples, processor 1101 includes an integrated circuit die packaged within the processor 1101. In general, the term "processor" may refer to any device or portion of a device that processes electronic data from registers and/or memory to transform that electronic data into other electronic data that may be stored in registers and/or memory. Any one or more device or component of computing device 1100 may include a die or device having any thin film capacitor structures and/or related characteristics discussed herein as discussed herein.

In various examples, one or more communication chips 1104, 1105 may also be physically and/or electrically coupled to the motherboard 1102. In further implementations, communication chips 1104 may be part of processor 1101. Depending on its applications, computing device 1100 may include other components that may or may not be physically and electrically coupled to motherboard 1102. These other components may include, but are not limited to, volatile memory (e.g., DRAM) 1107, 1108, non-volatile memory (e.g., ROM) 1110, a graphics processor 1112, flash memory, global positioning system (GPS) device 1113, compass 1114, a chipset 1106, an antenna 1116, a power amplifier 1109, a touchscreen controller 1111, a touchscreen display 1117, a speaker 1115, a camera 1103, a battery 1118, and a power supply 1119, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1104, 1105 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1104, 1105 may implement any of a number of wireless standards or protocols, including but not limited to those described elsewhere herein. As discussed, computing device 1100 may include a plurality of communication chips 1104, 1105. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 1119 may convert a source power from a source voltage to one or more voltages employed by other devices of mobile computing platform 1000. In some embodiments, power supply 1119 converts an AC power to DC power. In some embodiments, power supply 1119 converts an DC power to DC power at one or more different (lower) voltages. In some embodiments, multiple power supplies are staged to convert from AC to DC and then from DC at a higher voltage to DC at a lower voltage as specified by components of computing device 1100.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

In one or more first embodiments, a thin film capacitor comprises a first electrode, a second electrode, and a dielectric layer comprising titanium and oxygen between the first and second electrodes, wherein at least one of the first electrode or the second electrode comprises a noble metal and oxygen.

In one or more second embodiments, further to the first embodiments, the first electrode comprises the noble metal and oxygen and the second electrode comprises oxygen and one of the noble metal or a second noble metal.

In one or more third embodiments, further to the first or second embodiments, the first electrode comprises the noble metal and oxygen and the second electrode comprises one of the noble metal or a second noble metal and is substantially absent oxygen.

In one or more fourth embodiments, further to any of the first through third embodiments, the first electrode comprises the noble metal and not less than 30% oxygen and the noble metal comprises iridium.

In one or more fifth embodiments, further to any of the first through fourth embodiments, the thin film capacitor further comprises a layer comprising titanium on the first electrode.

In one or more sixth embodiments, further to any of the first through fifth embodiments, the second electrode comprises iridium and is substantially absent oxygen.

In one or more seventh embodiments, further to any of the first through sixth embodiments, the second electrode is on a copper layer.

In one or more eighth embodiments, further to any of the first through seventh embodiments, the second electrode comprises iridium and oxygen, and the thin film capacitor further comprises a copper layer and a second layer comprising iridium and substantially absent oxygen between the second electrode and the copper layer.

In one or more ninth embodiments, further to any of the first through eighth embodiments, the dielectric layer has a thickness in the range of 20 to 100 nm.

In one or more tenth embodiments, further to any of the first through ninth embodiments, the dielectric layer comprises one of nanocrystalline or amorphous titanium oxide.

In one or more eleventh embodiments, further to any of the first through tenth embodiments, the first electrode comprises the noble metal and not less than 30% oxygen, the noble metal comprises one of iridium, ruthenium, silver, or osmium, and the second electrode comprises one of iridium, ruthenium, silver, or osmium.

In one or more twelfth embodiments, a system comprises a power supply, an integrated circuit die over a package substrate and coupled to the power supply, and a thin film capacitor according to any of the first through eleventh embodiments.

In one or more thirteenth embodiments, a system comprises a power supply, an integrated circuit die over a package substrate and coupled to the power supply, and a thin film capacitor in the package substrate, the thin film capacitor comprising a dielectric layer comprising titanium and oxygen between first and second electrodes, wherein at least one of the first electrode or the second electrode comprises a noble metal and oxygen.

In one or more fourteenth embodiments, further to the thirteenth embodiments, the first electrode comprises the noble metal and not less than 30% oxygen, the noble metal comprises iridium, the second electrode comprises iridium and is substantially absent oxygen, and the thin film capacitor further comprises a layer comprising titanium on the first electrode.

In one or more fifteenth embodiments, further to the thirteenth or fourteenth embodiments, the dielectric layer comprises nanocrystalline or amorphous titanium oxide having a thickness in the range of 20 to 100 nm.

In one or more sixteenth embodiments, further to any of the thirteenth through fifteenth embodiments, the first electrode comprises the noble metal and not less than 30% oxygen, and the noble metal comprises one of iridium, ruthenium, silver, or osmium.

In one or more seventeenth embodiments, further to any of the thirteenth through sixteenth embodiments, the first electrode comprises the noble metal and oxygen and the second electrode comprises the noble metal and is substantially absent oxygen.

In one or more eighteenth embodiments, further to any of the thirteenth through seventeenth embodiments, the thin film capacitor comprises a component of a power delivery circuit, and the first electrode is to be negatively biased in operation of the power delivery circuit.

In one or more nineteenth embodiments, a method of forming a thin film capacitor comprises forming a first conductive layer over a substrate, disposing a first electrode layer over the first conductive layer, disposing a dielectric layer comprising titanium and oxygen on the first electrode layer, disposing an electrode layer on the dielectric layer, at least one of the first or second electrode layers comprising a noble metal and oxygen, disposing a conductive layer over the second electrode layer, and patterning the first electrode layer, the dielectric layer, the second electrode layer, and the conductive layer to form a thin film capacitor comprising a first electrode over the first conductive layer, a dielectric layer over the first electrode, a second electrode over the dielectric layer, and a second conductive layer over the second electrode.

In one or more twentieth embodiments, further to the nineteenth embodiments, one of the first or second electrode layers comprises the noble metal and not less than 30% oxygen, and the noble metal comprises one of iridium, ruthenium, silver, or osmium.

In one or more twenty-first embodiments, further to the nineteenth or twentieth embodiments, the first electrode layer comprises iridium and is substantially absent oxygen, the second electrode layer comprises the noble metal and not less than 30% oxygen, the noble metal comprises iridium, and the conductive layer comprises titanium.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A thin film capacitor structure, comprising
   a first electrode comprising a first compound of iridium and oxygen, wherein the first electrode is not less than 30% oxygen;
   a second electrode comprising a second compound of iridium and oxygen;
   a dielectric layer comprising a third compound of titanium and oxygen between the first and second electrodes, wherein the first compound of the first electrode is directly on the third compound of the dielectric layer, and wherein the second compound of the second electrode is directly on the third compound of the dielectric layer;
   a first layer comprising titanium on the first electrode;
   a copper layer; and
   a second layer comprising iridium and substantially absent oxygen between the second electrode and the copper layer.

2. The thin film capacitor structure of claim 1, wherein the first layer is on a second copper layer.

3. The thin film capacitor structure of claim 1, wherein the dielectric layer has a thickness in a range of 20 to 100 nm.

4. The thin film capacitor structure of claim 1, wherein the first compound of the dielectric layer comprises one of nanocrystalline or amorphous titanium oxide.

5. The thin film capacitor structure of claim 1, further comprising:
   a power supply;
   an integrated circuit die over a package substrate and coupled to the power supply; and
   a thin film capacitor in the package substrate, the thin film capacitor comprising the first electrode, the second electrode, the dielectric layer, the first layer, the copper layer, and the second layer.

6. A thin film capacitor structure, comprising:
   a first electrode comprising iridium oxide, wherein the first electrode is not less than 30% oxygen;
   a second electrode comprising iridium oxide; and
   a dielectric layer comprising titanium oxide between the first and second electrodes, wherein the iridium oxide of the first electrode is directly on the titanium oxide of the dielectric layer, and wherein the iridium oxide of the second electrode is directly on the titanium oxide of the dielectric layer;
   a first layer comprising titanium on the first electrode;
   a copper layer; and
   a second layer comprising iridium and substantially absent oxygen between the second electrode and the copper layer.

7. The thin film capacitor structure of claim 6, wherein the first layer is on a second copper layer.

8. The thin film capacitor structure of claim 6, wherein the dielectric layer has a thickness in a range of 20 to 100 nm.

9. The thin film capacitor structure of claim 6, wherein the titanium oxide of the dielectric layer comprises one of nanocrystalline or amorphous titanium oxide.

10. The thin film capacitor structure of claim 6, further comprising:
    a power supply;
    an integrated circuit die over a package substrate and coupled to the power supply; and
    a thin film capacitor in the package substrate, the thin film capacitor comprising the first electrode, the second electrode, the dielectric layer, the first layer, the copper layer, and the second layer.

11. A thin film capacitor structure, comprising
    a first electrode comprising a first compound of a noble metal and oxygen;
    a second electrode comprising a second compound comprising the noble metal or a second noble metal;
    a dielectric layer comprising a third compound of titanium and oxygen, wherein the first compound of the first electrode is directly on the third compound of the dielectric layer, and wherein the second compound of the second electrode is directly on the third compound of the dielectric layer;
    a first layer comprising titanium on the second electrode;
    a copper layer; and
    a second layer comprising the noble metal and substantially absent oxygen between the first electrode and the copper layer.

12. The thin film capacitor structure of claim 11, wherein the noble metal comprises iridium.

13. The thin film capacitor structure of claim 12, wherein the second electrode comprises a second compound of iridium and oxygen.

14. The thin film capacitor structure of claim 11, wherein the first layer is on a second copper layer.

15. The thin film capacitor structure of claim 11, further comprising:
    a power supply;
    an integrated circuit die over a package substrate and coupled to the power supply; and
    a thin film capacitor in the package substrate, the thin film capacitor comprising the first electrode, the second electrode, the dielectric layer, the first layer, the copper layer, and the second layer.

16. A thin film capacitor structure, comprising
    a first electrode comprising a noble metal oxide;
    a second electrode comprising the noble metal of the noble metal oxide or a second noble metal;
    a dielectric layer comprising titanium oxide, wherein the noble metal oxide of the first electrode is directly on the titanium oxide of the dielectric layer, and wherein the second electrode is directly on the titanium oxide of the dielectric layer;

a first layer comprising titanium on the second electrode;

a copper layer; and a second layer comprising the noble metal of the noble metal oxide and substantially absent oxygen between the first electrode and the copper layer.

17. The thin film capacitor structure of claim 16, wherein the noble metal of the noble metal oxide comprises iridium.

18. The thin film capacitor structure of claim 17, wherein the second electrode comprises iridium oxide.

19. The thin film capacitor structure of claim 16, wherein the first layer is on a second copper layer.

20. The thin film capacitor structure of claim 16, further comprising:

a power supply;

an integrated circuit die over a package substrate and coupled to the power supply; and a thin film capacitor in the package substrate, the thin film capacitor comprising the first electrode, the second electrode, the dielectric layer, the first layer, the copper layer, and the second layer.

\* \* \* \* \*